United States Patent
Yunoki et al.

(10) Patent No.: US 9,722,567 B2
(45) Date of Patent: Aug. 1, 2017

(54) VARIABLE-FREQUENCY RESONANCE CIRCUIT AND VARIABLE-FREQUENCY FILTER

(71) Applicant: Murata Manufacturing Co., Ltd., Nagaokakyo-shi, Kyoto-fu (JP)

(72) Inventors: Yasushi Yunoki, Nagaokakyo (JP); Tetsuo Taniguchi, Nagaokakyo (JP); Keisuke Katabuchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 107 days.

(21) Appl. No.: 14/548,457

(22) Filed: Nov. 20, 2014

(65) Prior Publication Data
US 2015/0162888 A1 Jun. 11, 2015

(30) Foreign Application Priority Data
Dec. 6, 2013 (JP) .................... 2013-253483

(51) Int. Cl.
*H03H 7/01* (2006.01)
*H03H 7/09* (2006.01)
*H03H 1/00* (2006.01)

(52) U.S. Cl.
CPC ........ *H03H 7/0161* (2013.01); *H03H 7/0115* (2013.01); *H03H 7/0123* (2013.01);
(Continued)

(58) Field of Classification Search
CPC ............ H03H 2001/0085; H03H 7/09; H03H 7/0115; H03H 7/0123; H03H 7/0161; H03H 7/1758
(Continued)

(56) References Cited

U.S. PATENT DOCUMENTS 4,126,837 A * 11/1978 Koyamada ........... H03H 9/0028
   333/193
8,289,103 B2 * 10/2012 Yamakawa .......... H03H 7/0115
   333/174
(Continued)

FOREIGN PATENT DOCUMENTS

JP         09-181538 A       7/1997

OTHER PUBLICATIONS http://www.allaboutcircuits.com/video-lectures/ground-reference-points/ ; Oct. 26, 2016.*

*Primary Examiner* — Stephen E Jones
*Assistant Examiner* — Rakesh Patel
(74) *Attorney, Agent, or Firm* — Keating & Bennett, LLP

(57) ABSTRACT

A variable-frequency resonance circuit includes first and second input/output terminals and a resonance circuit portion. The resonance circuit portion includes a first inductor and first and second LC series circuits. The resonance circuit portion is connected between a ground and a transmission line that connects the first and second input/output terminals. The first LC series circuit includes a second inductor and a variable capacitor connected in series with each other. The second LC series circuit includes a third inductor and a fixed capacitor connected in series with each other. The first and second LC series circuits are connected in parallel between the first inductor and a ground. The first and second inductors are configured such that positive-coupling mutual inductance is produced therebetween.

19 Claims, 13 Drawing Sheets

(52) U.S. Cl.
CPC ............ *H03H 7/09* (2013.01); *H03H 7/1758* (2013.01); *H03H 2001/0085* (2013.01)

(58) Field of Classification Search
USPC ................................ 333/168, 174–177, 185
See application file for complete search history.

(56) References Cited

U.S. PATENT DOCUMENTS

| | | | |
|---|---|---|---|
| 2007/0188265 A1* | 8/2007 | Perreault | ................ H03H 7/427 333/181 |
| 2011/0205139 A1* | 8/2011 | Yoshikawa | ............... H01P 1/20 343/850 |
| 2012/0229318 A1* | 9/2012 | Jin | ........................ H03H 7/075 341/155 |

* cited by examiner

WIDTHWISE DIRECTION
(SECOND DIRECTION)

LONGITUDINAL DIRECTION
(FIRST DIRECTION)

1

VARIABLE-FREQUENCY RESONANCE CIRCUIT AND VARIABLE-FREQUENCY FILTER

BACKGROUND OF THE INVENTION

1. Field of the Invention

The present invention relates to a variable-frequency resonance circuit using inductors and a variable capacitor and to a variable-frequency filter including a plurality of variable-frequency resonance circuits.

2. Description of the Related Art

Various types of resonance circuits for setting a pass band and an attenuation band by using a resonant frequency of an inductor and that of a capacitor have been proposed. Various types of high-frequency filters including a plurality of such resonance circuits have also been proposed. As a resonance circuit or a high-frequency filter of this type, various variable-frequency resonance circuits and variable-frequency filters that can adjust their characteristics have been proposed. Examples of the characteristics of a resonance circuit or a high-frequency filter are transmission characteristics, attenuation characteristics, and insertion loss.

A variable-frequency resonance circuit or a variable-frequency filter includes a variable capacitor, and by changing the capacitance of the variable capacitor, the characteristics are adjusted.

For example, Japanese Unexamined Patent Application Publication No. 9-181538 discloses a variable-frequency filter shown in FIG. 12. FIG. 12 is a circuit diagram of such a variable-frequency filter 10P. The variable-frequency filter 10P includes first and second LC parallel resonance circuits that each include an inductor 20P, a variable capacitor 31P, and a capacitor 32P. These first and second LC parallel resonance circuits are connected between a ground and a transmission line for connecting first and second input/output terminals P1 and P2. A capacitor 401 is connected between the first input/output terminal P1 and a node between the transmission line and the first LC parallel resonance circuit. A capacitor 402 is connected between the second input/output terminal P2 and a node between the transmission line and the second LC parallel resonance circuit. A coupling capacitor 410 is connected between the node between the transmission line and the first LC parallel resonance circuit and the node between the transmission line and the second LC parallel resonance circuit.

In the above-described variable-frequency filter 10P, by changing the capacitance of the variable capacitors 31P of the first and second LC parallel resonance circuits, the frequency of a pass band or that of an attenuation band is adjusted.

However, the above-described variable-frequency filter 10P presents the following problem. FIGS. 13A and 13B are diagrams illustrating the transmission characteristics of the variable-frequency filter 10P. In FIGS. 13A and 13B, the solid line indicates the transmission characteristics exhibited when a substantially 400-MHz band is set as the pass band, while the broken line indicates the transmission characteristics exhibited when a substantially 520-MHz band is set as the pass band. In FIGS. 13A and 13B, BWf1$p$ indicates the pass band width when a substantially 400-MHz band is set as the pass band, while BWf2$p$ indicates the pass band width when a substantially 520-MHz band is set as the pass band. BWf1$p'$ indicates an imaginary pass band when the pass band width BWf1$p$ is superimposed on the pass band width BWf2$p$.

As shown in FIGS. 13A and 13B, the pass band widths BWf1$p$ and BWf1$p'$ are wider than the pass band width BWf2$p$.

In this manner, in the variable-frequency filter 10P having the above-described circuit configuration, the pass band width varies depending on a set frequency pass band.

SUMMARY OF THE INVENTION

Accordingly, preferred embodiments of the present invention provide a variable-frequency resonance circuit and a variable-frequency filter in which the pass band width is unchanged or substantially unchanged even when the frequency of the pass band is shifted.

According to a preferred embodiment of the present invention, a variable-frequency resonance circuit includes a first inductor that is connected at one end to a transmission line, a first LC series circuit that is connected to the other end of the first inductor and that includes a second inductor and a variable capacitor, and a second LC series circuit that is connected to the other end of the first inductor and that includes a third inductor and a fixed capacitor. The first and second LC series circuits are connected in parallel between the first inductor and a ground. The first and second inductors are mutual-inductively and positively coupled with each other.

With this circuit configuration, the pass band width is unchanged or substantially unchanged even when the frequency of the pass band is shifted by changing the capacitance of the variable capacitor.

In this variable-frequency resonance circuit, the second LC series circuit may preferably include a fourth inductor connected in series with the third inductor and the fixed capacitor.

With this configuration, an attenuation pole is provided at a high frequency side of the pass band, thus achieving steep attenuation characteristics at a high frequency side of the pass band.

The variable-frequency filter may preferably include a plurality of the above-described variable-frequency resonance circuits. An inter-resonator coupling element may preferably be connected to the transmission line that connects the plurality of variable-frequency resonance circuits.

With this configuration, the transmission characteristics of a desired frequency range preferably are changed more easily.

The variable-frequency filter may be configured as follows. The variable-frequency filter may include a plurality of variable-frequency resonance circuits each including the fourth inductor. An inter-resonator coupling element may be connected to the transmission line that connects the plurality of variable-frequency resonance circuits. At least one of the fourth inductors disposed in the plurality of variable-frequency resonance circuits may be commonly used for the plurality of variable-frequency resonance circuits.

With this configuration, some of the components of the plurality of variable-frequency resonance circuits are commonly used for the plurality of variable-frequency resonance circuits, thus making it possible to reduce the size of the variable-frequency filter while still obtaining desired characteristics.

In this variable-frequency filter, the inter-resonator coupling element may preferably be a capacitor.

The variable-frequency filter may be configured as follows. The plurality of variable-frequency resonance circuits may be defined by a multilayer body including a plurality of dielectric layers stacked on each other. By providing conductor patterns on the multilayer body, components of each of the variable-frequency resonance circuits other than the variable capacitor of the first LC series circuit may be included in the multilayer body. Each of the first and second inductors may be defined by a spiral conductor pattern having a central axis parallel or substantially parallel to a stacking direction of the plurality of dielectric layers of the multilayer body, and an opening at a central portion of the spiral conductor pattern defining the first inductor may be at least partially superimposed on an opening at a central portion of the spiral conductor pattern forming the second inductor. A conductor pattern defining the fixed capacitor and a conductor pattern defining the inter-resonator coupling element are arranged such that the dielectric layers defining the first and second inductors are sandwiched between the conductor pattern defining the fixed capacitor and the conductor pattern defining the inter-resonator coupling element.

With this configuration, it is possible to prevent or significantly reduce unwanted coupling between the fixed capacitor and the inter-resonator coupling element.

In the variable-frequency filter, the conductor pattern defining the fixed capacitor and the conductor pattern defining the inter-resonator coupling element provided on dielectric layers positioned closest to a dielectric layer defining the first inductor and a dielectric layer defining the second inductor may preferably be arranged such that the conductor pattern defining the fixed capacitor and the conductor pattern defining the inter-resonator coupling element are neither superimposed on the opening at the central portion of the spiral conductor pattern defining the first inductor nor the opening at the central portion of the spiral conductor pattern defining the second inductor.

With this configuration, since both ends of the openings at the central portions of the first and second inductors are not covered by the conductor pattern defining the fixed capacitor and the conductor pattern defining the inter-resonator coupling element, characteristics of the first and second inductors are improved.

The variable-frequency resonance circuit may preferably be configured as follows. The variable-frequency resonance circuit may be defined by a multilayer body including a plurality of dielectric layers stacked on each other. By providing conductor patterns on the dielectric layers of the multilayer body, components of the variable-frequency resonance circuit other than the variable capacitor of the first LC series circuit may be provided in the multilayer body. Each of the first and second inductors may be defining by a spiral conductor pattern having a central axis parallel or substantially parallel to a stacking direction of the plurality of dielectric layers of the multilayer body, and an opening at a central portion of the spiral conductor pattern defining the first inductor may be at least partially superimposed on an opening at a central portion of the spiral conductor pattern defining the second inductor.

With this configuration, a portion of the variable-frequency resonance circuit having the above-described circuit configuration and characteristics is configured so as to have a small size by using a multilayer body.

In the variable-frequency resonance circuit, the third inductor may preferably be defined by a via-conductor extending in parallel or substantially parallel to the stacking direction.

With this configuration, it is possible to prevent or significantly reduce unwanted coupling between the third inductor and the first and second inductors.

The variable-frequency filter may preferably be configured as follows. The plurality of variable-frequency resonance circuits may be defined by a multilayer body including a plurality of dielectric layers stacked on each other. By providing conductor patterns on the dielectric layers of the multilayer body, components of each of the variable-frequency resonance circuits other than the variable capacitor of the first LC series circuit may be provided in the multilayer body. Each of the first and second inductors may be defined by a spiral conductor pattern having a central axis parallel or substantially parallel to a stacking direction of the plurality of dielectric layers of the multilayer body, and an opening at a central portion of the spiral conductor pattern defining the first inductor may be at least partially superimposed on an opening at a central portion of the spiral conductor pattern defining the second inductor. An extending direction of conductor patterns defining the fourth inductors separately used for the plurality of variable-frequency resonance circuits may be perpendicular or substantially perpendicular to an extending direction of a conductor pattern defining the at least one of the fourth inductors commonly used for the plurality of variable-frequency resonance circuits.

With this configuration, it is possible to prevent or significantly reduce unwanted coupling between the fourth inductors separately used for the plurality of variable-frequency resonance circuits and the fourth inductor commonly used for the plurality of variable-frequency resonance circuits.

In the variable-frequency filter, an extending direction of a conductor pattern defining the third inductor may preferably be perpendicular or substantially perpendicular to an extending direction of the conductor patterns defining the fourth inductors.

With this configuration, it is possible to prevent or significantly reduce unwanted coupling between the third inductor and the fourth inductors.

In the variable-frequency resonance circuit and the variable-frequency filter, a winding direction of the first inductor and a winding direction of the second inductor may preferably be identical or substantially identical to each other.

With this configuration, it is possible to easily provide conductor patterns that produce positive-coupling mutual inductance.

In the variable-frequency resonance circuit and the variable-frequency filter according to various preferred embodiments of the present invention, the pass band width is unchanged or substantially unchanged even when the frequency of the pass band is shifted.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
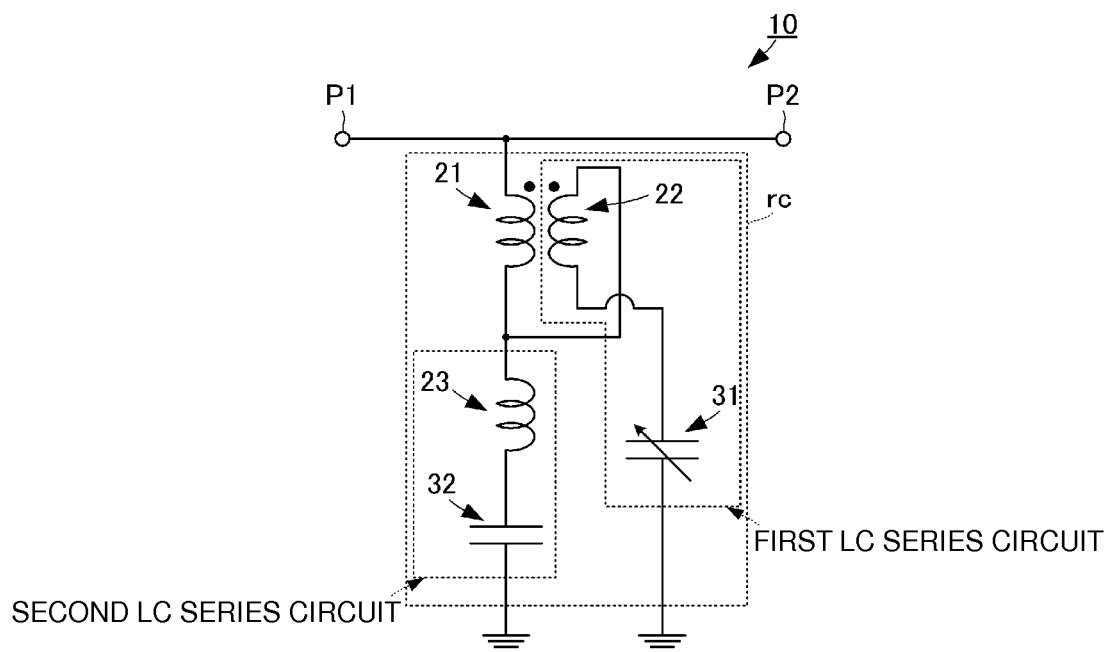
FIG. 1 is a circuit diagram illustrating a variable-frequency resonance circuit according to a first preferred embodiment of the present invention.

A variable-frequency resonance circuit and a variable-frequency filter according to a first preferred embodiment of the present invention will be described below with reference to the accompanying drawings. FIG. 1 is a circuit diagram illustrating a variable-frequency resonance circuit 10 according to the first preferred embodiment.

The variable-frequency resonance circuit 10 includes, as shown in FIG. 1, first and second input/output terminals P1 and P2. The first and second input/output terminals P1 and P2 are connected to each other via a high-frequency signal transmission line. A resonance circuit portion rc includes an inductor 21 (corresponding to a first inductor) and first and second LC series circuits. The resonance circuit portion rc is connected between the transmission line and a ground.

More specifically, one end of the inductor 21 is connected to the transmission line, and the other end of the inductor 21 is connected to a ground via a parallel circuit constituted by the first and second LC series circuits.

The first LC series circuit includes an inductor (corresponding to a second inductor) and a variable capacitor 31 connected in series with each other. One end of the inductor 22 is connected to the other end of the inductor 21 (the end opposite to the end connected to the transmission line), and the other end of the inductor 22 is connected to one end of the variable capacitor 31. The other end of the variable capacitor 31 is connected to a ground.

The second LC series circuit includes an inductor 23 (corresponding to a third inductor) and a fixed capacitor connected in series with each other. One end of the inductor 23 is connected to the other end of the inductor 21, and the other end of the inductor 23 is connected to one end of the fixed capacitor 32. The other end of the fixed capacitor 32 is connected to a ground.

The inductors 21 and 22 are arranged such that positive-coupling mutual inductance is produced therebetween.

With this circuit configuration, a resonance circuit having a pass band of a certain pass band width is provided. By changing the capacitance of the variable capacitor 31, the frequency of the pass band of the variable-frequency resonance circuit 10 is shifted.

The specific circuit configuration will be discussed below. Two first and second LC series circuits are connected in parallel with the inductor 21, and the first and second LC series circuits and the inductor 21 are connected between the transmission line and grounds. The first LC series circuit includes the variable capacitor 31, and positive-coupling mutual inductance is produced by the inductor 21 and the inductor 22 which is connected in series with the variable capacitor 31. With this circuit configuration, the band width is unchanged or substantially unchanged even when the frequency of the pass band is shifted.

Figure 2:
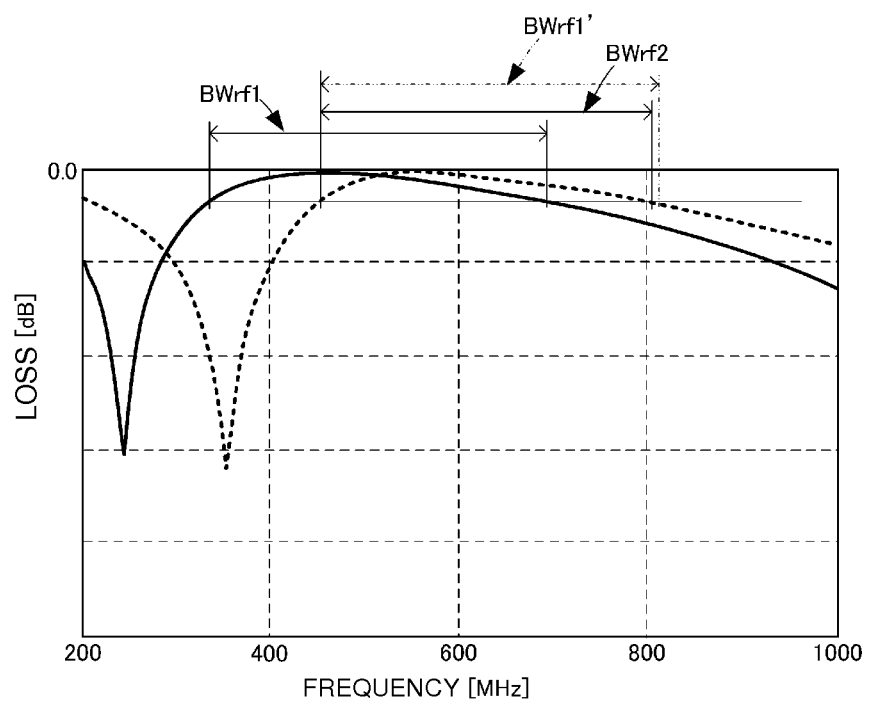
FIG. 2 is a diagram illustrating the transmission characteristics of the variable-frequency resonance circuit according to the first preferred embodiment of the present invention.

FIG. 2 is a diagram illustrating the transmission characteristics of the variable-frequency resonance circuit 10 of the first preferred embodiment.

In FIG. 2, the solid line indicates the transmission characteristics exhibited when a substantially 400-MHz band is set as the pass band, while the broken line indicates the transmission characteristics exhibited when a substantially 520-MHz band is set as the pass band. In FIG. 2, BWrf1 indicates the pass band width when a substantially 400-MHz band is set as the pass band, while BWrf2 indicates the pass band width when a substantially 520-MHz band is set as the pass band. BWrf1' indicates an imaginary pass band when the pass band width BWrf1 is superimposed on the pass band width BWrf2.

As shown in FIG. 2, the pass band width BWrf1 (BWrf1') in a substantially 400-MHz band is substantially the same as the pass band width BWrf2 in a substantially 520-MHz band. In this manner, with the configuration of the variable-frequency resonance circuit 10, the band width is unchanged or substantially unchanged even when the frequency of the pass band is shifted.

In FIG. 1, the variable-frequency resonance circuit 10 including only one resonance circuit portion rc is shown. However, a variable-frequency filter including two resonance circuit portions, such as that shown in FIG. 3, or a variable-frequency filter including three or more resonance circuit portions may be provided.

Figure 3:
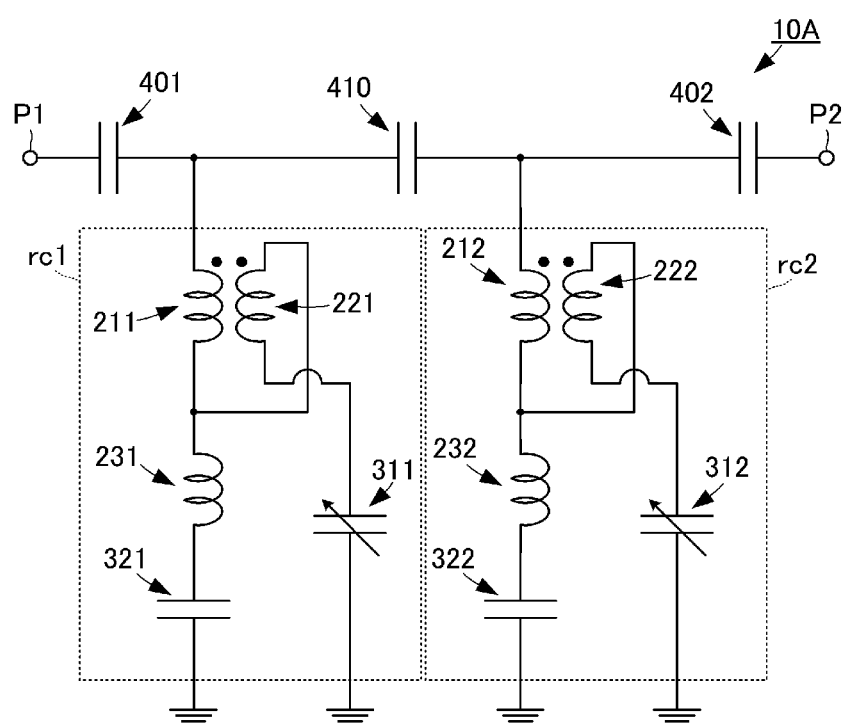
FIG. 3 is a circuit diagram illustrating a variable-frequency filter according to the first preferred embodiment of the present invention.

FIG. 3 is a circuit diagram illustrating a variable-frequency filter 10A of the first preferred embodiment.

The variable-frequency filter 10A includes, as shown in FIG. 3, first and second input/output terminals P1 and P2. The first and second input/output terminals P1 and P2 are connected to each other via a high-frequency signal transmission line. First and second resonance circuit portions rc1 and rc2 are connected between the transmission line and a ground. An input/output coupling capacitor 401 is connected between the first input/output terminal P1 and a node between the first resonance circuit portion rc1 and the transmission line. An input/output coupling capacitor 402 is connected between the second input/output terminal P2 and a node between the second resonance circuit portion rc2 and the transmission line. An inter-resonator coupling capacitor 410 is connected between the node between the first resonance circuit portion rc1 and the transmission line and the node between the second resonance circuit portion rc2 and the transmission line.

The first resonance circuit portion rc1 includes inductors 211, 221, and 231, a variable capacitor 311, and a fixed capacitor 321.

One end of the inductor 211 is connected to the transmission line, and the other end of the inductor 211 is connected to a ground via a parallel circuit defined by first and second LC series circuits.

The first LC series circuit includes the inductor 221 (corresponding to a second inductor) and the variable capacitor 311 connected in series with each other. One end of the inductor 221 is connected to the other end of the inductor 211 (the end opposite to the end connected to the transmission line), and the other end of the inductor 221 is connected to one end of the variable capacitor 311. The other end of the variable capacitor 311 is connected to a ground.

The second LC series circuit includes the inductor 231 (corresponding to a third inductor) and the fixed capacitor 321 connected in series with each other. One end of the inductor 231 is connected to the other end of the inductor 211, and the other end of the inductor 231 is connected to one end of the fixed capacitor 321. The other end of the fixed capacitor 321 is connected to a ground.

The inductors 211 and 221 are arranged such that positive-coupling mutual inductance is produced therebetween.

The second resonance circuit portion rc2 includes inductors 212, 222, and 232, a variable capacitor 312, and a fixed capacitor 322.

One end of the inductor 212 is connected to the transmission line, and the other end of the inductor 212 is connected to a ground via a parallel circuit defined by first and second LC series circuits.

The first LC series circuit includes the inductor 222 (corresponding to a second inductor) and the variable capacitor 312 connected in series with each other. One end of the inductor 222 is connected to the other end of the inductor 212 (the end opposite to the end connected to the transmission line), and the other end of the inductor 222 is connected to one end of the variable capacitor 312. The other end of the variable capacitor 312 is connected to a ground.

The second LC series circuit includes the inductor 232 (corresponding to a third inductor) and the fixed capacitor 322 connected in series with each other. One end of the inductor 232 is connected to the other end of the inductor 212, and the other end of the inductor 232 is connected to one end of the fixed capacitor 322. The other end of the fixed capacitor 322 is connected to a ground.

The inductors 212 and 222 are arranged such that positive-coupling mutual inductance is produced therebetween.

In the variable-frequency filter 10A including a plurality of resonance circuit portions rc1 and rc2, the band width is unchanged or substantially unchanged even when the frequency of the pass band is shifted, in a manner similar to the variable-frequency resonance circuit 10.

Figure 4A:
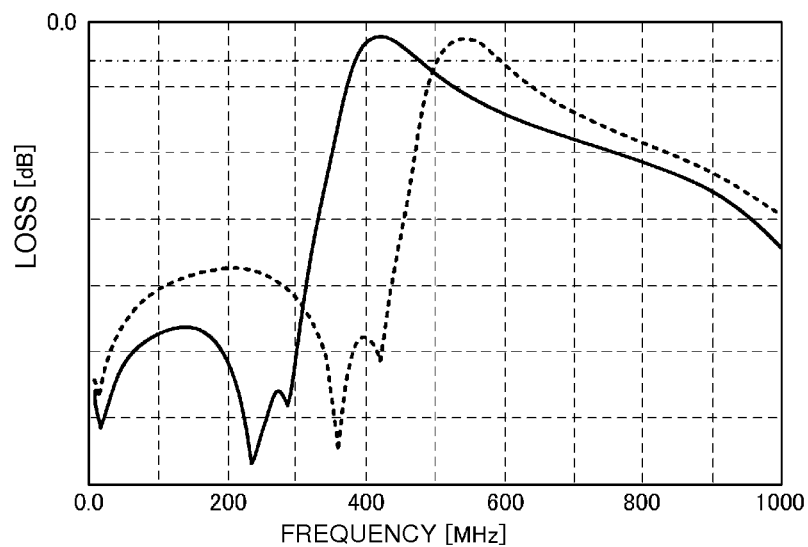
FIGS. 4A and 4B are diagrams illustrating the transmission characteristics of the variable-frequency filter according to the first preferred embodiment of the present invention.
Figure 4B:
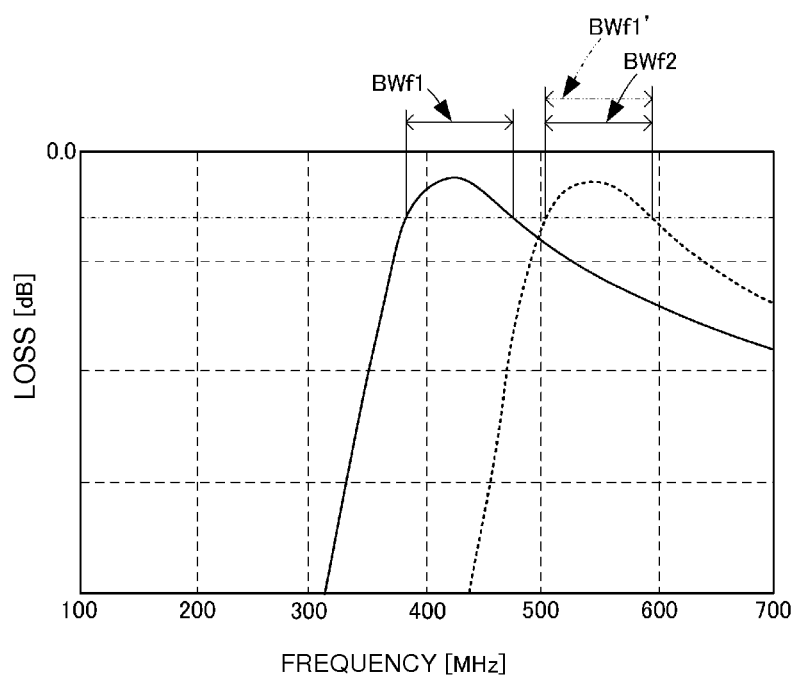

FIGS. 4A and 4B are diagrams illustrating the transmission characteristics of the variable-frequency filter 10A of the first preferred embodiment. FIG. 4A illustrates the transmission characteristics in a wide frequency range, while FIG. 4B is an enlarged diagram illustrating the transmission characteristics in a frequency range including the pass band.

In FIGS. 4A and 4B, the solid line indicates the transmission characteristics exhibited when a substantially 400-MHz band is set as the pass band, while the broken line indicates the transmission characteristics exhibited when a substantially 520-MHz band is set as the pass band. In FIG. 4B, BWf1 indicates the pass band width when a substantially 400-MHz band is set as the pass band, while BWf2 indicates the pass band width when a substantially 520-MHz band is set as the pass band. BWf1' indicates an imaginary pass band when the pass band width BWf1 is superimposed on the pass band width BWf2.

As shown in FIG. 4B, the pass band width BWf1 (BWf1') in a substantially 400-MHz band is substantially the same as the pass band width BWf2 in a substantially 520-MHz band. In this manner, with the configuration of the variable-frequency filter 10A including a plurality of resonance circuit portions rc1 and rc2, the band width is unchanged or substantially unchanged even when the frequency of the pass band is shifted.

Since the variable-frequency filter 10A includes a plurality of variable-frequency resonance circuits, desired transmission characteristics and attenuation characteristics are achieved more precisely and more easily.

Figure 5A:
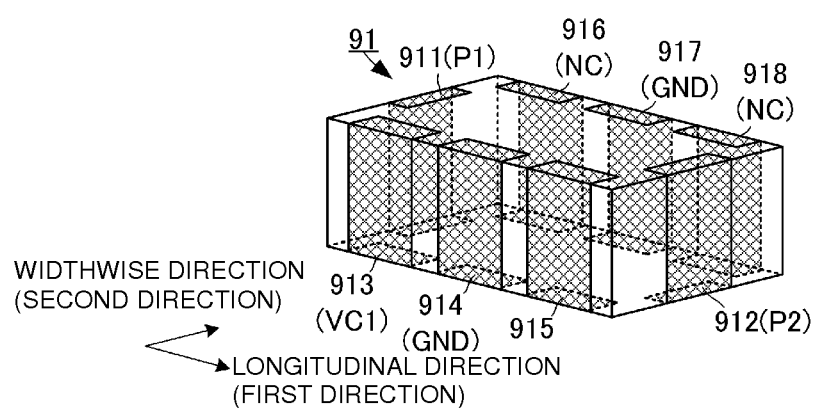
FIGS. 5A and 5B are external perspective views illustrating the frequency-variable filter according to the first preferred embodiment of the present invention.
Figure 5B:
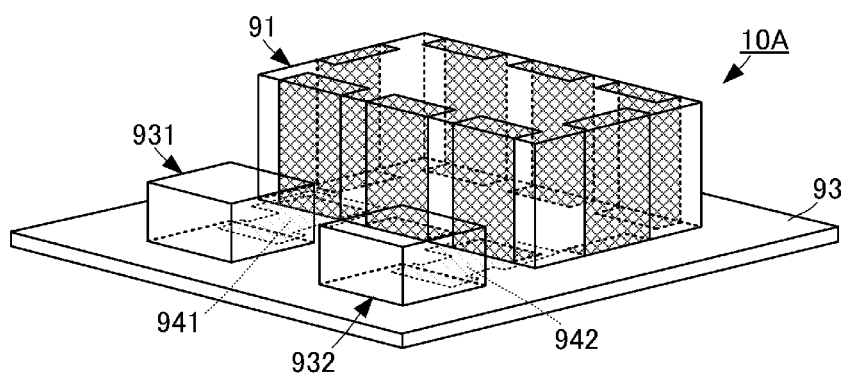
Figure 6:
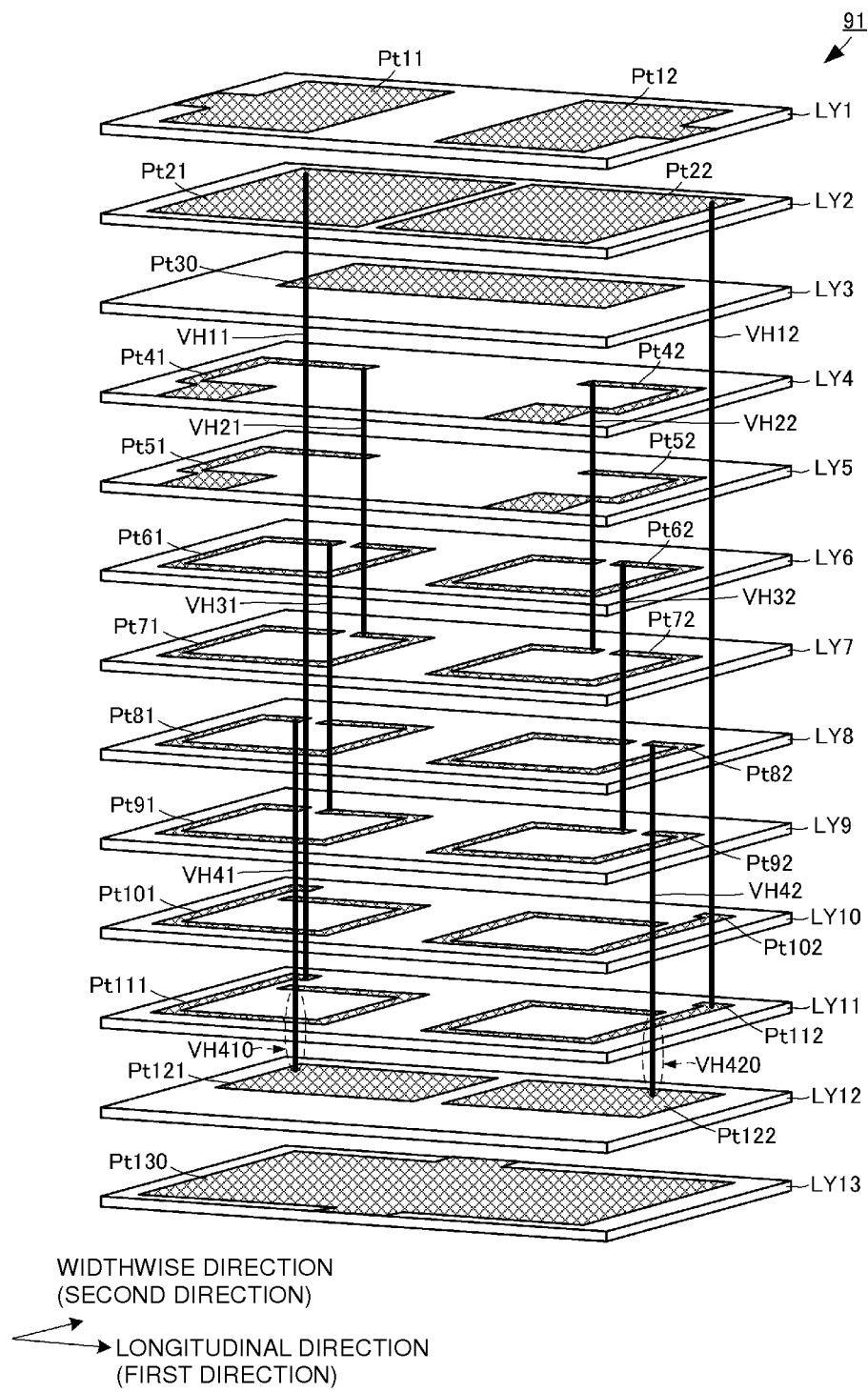
FIG. 6 is an exploded perspective view illustrating the structure of individual layers of a multilayer body for implementing the variable-frequency filter according to the first preferred embodiment of the present invention.

The variable-frequency filter 10A having the above-described circuit configuration preferably has the following structure. FIGS. 5A and 5B are external perspective views illustrating the frequency-variable filter 10A of the first preferred embodiment. FIG. 5A is an external perspective view illustrating a multilayer body defining the frequency-variable filter 10A of the first preferred embodiment, except for variable capacitors. FIG. 5B is an external perspective view illustrating the variable-frequency filter 10A. FIG. 6 is an exploded perspective view illustrating the structure of individual layers of the multilayer body used for the variable-frequency filter 10A of the first preferred embodiment.

The variable-frequency filter 10A includes, as shown in FIG. 5B, a multilayer body 91, a base substrate 93, and mounting variable capacitors 931 and 932. The multilayer body 91 is formed preferably by stacking a plurality of dielectric layers including conductor patterns provided thereon and by sintering the stacked dielectric layers. The multilayer body 91 preferably has a rectangular or substantially rectangular parallelepiped shape.

An external connecting terminal 911 is provided on a first end surface, which is one end surface in the longitudinal direction of the multilayer body 91. The external connecting terminal 911 corresponds to the first input/output terminal P1.

An external connecting terminal 912 is provided on a second end surface, which is the other end surface in the longitudinal direction of the multilayer body 91. The external connecting terminal 912 corresponds to the second input/output terminal P2.

External connecting terminals 913, 914, and 915 are provided on a first side surface, which is one end surface in the widthwise direction of the multilayer body 91. The external connecting terminals 913, 914, and 915 are arranged from the first end surface to the second end surface in this order. The external connecting terminal 913 is a first variable capacitor connecting terminal, and the external connecting terminal 915 is a second variable capacitor connecting terminal. The external connecting terminal 914 is a ground connecting terminal.

External connecting terminals 916, 917, and 918 are provided on a second side surface, which is the other end surface in the widthwise direction of the multilayer body 91. The external connecting terminals 916, 917, and 918 are arranged from the first end surface to the second end surface in this order. The external connecting terminals 916 and 918 are no contact (NC) terminals. The external connecting terminal 917 is a ground connecting terminal.

The multilayer body 91 and the mounting variable capacitors 931 and 932 are mounted on the base substrate 93. The external connecting terminal 913 of the multilayer body 91 is connected to the mounting variable capacitor 931 via a conductor pattern 941 provided on the base substrate 93. The external connecting terminal 915 of the multilayer body 91 is connected to the mounting variable capacitor 932 via a conductor pattern 942 provided on the base substrate 93.

The structure of the multilayer body 91 will be more specifically described below. In the following description, the state in which the multilayer body 91 is viewed in the stacking direction will be referred to as a state in which the multilayer body 91 is viewed from above.

As shown in FIG. 6, the multilayer body 91 includes thirteen dielectric layers LY1 through LY13. A dielectric layer on which no conductor pattern is provided may preferably be disposed on top of the dielectric layer LY1.

Conductor patterns Pt11 and Pt12 are provided on the surface of the dielectric layer LY1. The conductor patterns Pt11 and Pt12 preferably have a rectangular or substantially rectangular shape. The conductor pattern Pt11 is disposed close to the first end surface of the dielectric layer LY1. A portion of the conductor pattern Pt11 extends to the first end surface and is connected to the external connecting terminal 911. The conductor pattern Pt12 is disposed close to the second end surface of the dielectric layer LY1. A portion of the conductor pattern Pt12 extends to the second end surface and is connected to the external connecting terminal 912.

Conductor patterns Pt21 and Pt22 are provided on the surface of the dielectric layer LY2. The conductor patterns Pt21 and Pt22 preferably have a rectangular or substantially rectangular shape. The conductor pattern Pt21 is disposed close to the first end surface of the dielectric layer LY2 such that it opposes the conductor pattern Pt11 but does not oppose the conductor pattern Pt12. The conductor pattern Pt22 is disposed close to the second end surface of the dielectric layer LY2 such that it opposes the conductor pattern Pt12 but does not oppose the conductor pattern Pt11.

The conductor patterns Pt11 and Pt21 and the dielectric layer LY2 define the input/output coupling capacitor 401. The conductor patterns Pt12 and Pt22 and the dielectric layer LY2 define the input/output coupling capacitor 402.

A conductor pattern Pt30 is provided on the surface of the dielectric layer LY3. The conductor pattern Pt30 preferably has a rectangular or substantially rectangular shape. The conductor pattern Pt30 opposes both of the conductor patterns Pt21 and Pt22. The conductor pattern Pt30 is disposed close to the second side surface of the dielectric layer LY3 and is not disposed close to the first side surface.

The conductor patterns Pt21, Pt22, and Pt30 and the dielectric layer LY3 define the inter-resonator coupling capacitor 410.

Conductor patterns Pt41 and Pt42 are provided on the surface of the dielectric layer LY4. The conductor patterns Pt41 and Pt42 are linear conductors preferably having a substantially angular C shape, as viewed from above. The conductor pattern Pt41 is disposed close to the first end surface of the dielectric layer LY4. One end of the conductor pattern Pt41 is wider than other portions of the conductor pattern Pt41 and extends to the first side surface. The portion extending to the first side surface is connected to the external connecting terminal 913. The conductor pattern Pt42 is disposed close to the second end surface of the dielectric layer LY4. One end of the conductor pattern Pt42 is wider than other portions of the conductor pattern Pt42 and extends to the first side surface. The portion extending to the first side surface is connected to the external connecting terminal 915.

Conductor patterns Pt51 and Pt52 are provided on the surface of the dielectric layer LY5. The conductor patterns Pt51 and Pt52 preferably have the same or substantially the same shape as that of the conductor patterns Pt41 and Pt42 provided on the dielectric layer LY4. The conductor patterns Pt51 and Pt52 are respectively superimposed on the conductor patterns Pt41 and Pt42 provided on the dielectric layer LY4, as viewed from above.

Conductor patterns Pt61 and Pt62 are provided on the surface of the dielectric layer LY6. The conductor patterns Pt61 and Pt62 are linear conductors preferably having a substantially angular C shape, as viewed from above. The conductor pattern Pt61 is disposed close to the first end surface of the dielectric layer LY6. The conductor pattern Pt62 is disposed close to the second end surface of the dielectric layer LY6.

Conductor patterns Pt71 and Pt72 are provided on the surface of the dielectric layer LY7. The conductor patterns Pt71 and Pt72 preferably have the same or substantially the same shape as that of the conductor patterns Pt61 and Pt62 provided on the dielectric layer LY6. The conductor patterns Pt71 and Pt72 are respectively superimposed on the conductor patterns Pt61 and Pt62 provided on the dielectric layer LY6, as viewed from above.

One end of each of the conductor patterns Pt61 and Pt71 is connected to the other ends of the conductor patterns Pt41 and Pt51 (the ends opposite to the wider ends) through a via-conductor VH21 extending in the stacking direction of the dielectric layers.

One end of each of the conductor patterns Pt62 and Pt72 is connected to the other ends of the conductor patterns Pt42 and Pt52 (the ends opposite to the wider ends) through a via-conductor VH22 extending in the stacking direction of the dielectric layers.

Conductor patterns Pt81 and Pt82 are provided on the surface of the dielectric layer LY8. The conductor patterns Pt81 and Pt82 are linear conductors preferably having a substantially angular C shape, as viewed from above. The conductor pattern Pt81 is disposed close to the first end surface of the dielectric layer LY8. The conductor pattern Pt82 is disposed close to the second end surface of the dielectric layer LY8.

Conductor patterns Pt91 and Pt92 are provided on the surface of the dielectric layer LY9. The conductor patterns Pt91 and Pt92 preferably have the same or substantially the same shape as that of the conductor patterns Pt81 and Pt82 provided on the dielectric layer LY8. The conductor patterns Pt91 and Pt92 are respectively superimposed on the conductor patterns Pt81 and Pt82 provided on the dielectric layer LY8, as viewed from above.

One end of each of the conductor patterns Pt81 and Pt91 is connected to the other ends of the conductor patterns Pt61 and Pt71 through a via-conductor VH31 extending in the stacking direction of the dielectric layers.

One end of each of the conductor patterns Pt82 and Pt92 is connected to the other ends of the conductor patterns Pt62 and Pt72 through a via-conductor VH32 extending in the stacking direction of the dielectric layers.

Conductor patterns Pt101 and Pt102 are provided on the surface of the dielectric layer LY10. The conductor patterns Pt101 and Pt102 are linear conductors preferably having a substantially angular C shape, as viewed from above. The conductor pattern Pt101 is disposed close to the first end surface of the dielectric layer LY10. The conductor pattern Pt102 is disposed close to the second end surface of the dielectric layer LY10.

Conductor patterns Pt111 and Pt112 are provided on the surface of the dielectric layer LY11. The conductor patterns Pt111 and Pt112 preferably have the same or substantially the same shape as that of the conductor patterns Pt101 and Pt102 provided on the dielectric layer LY10. The conductor patterns Pt111 and Pt112 are respectively superimposed on the conductor patterns Pt101 and Pt102 provided on the dielectric layer LY10, as viewed from above.

One end of each of the conductor patterns Pt101 and Pt111 is connected to the other ends of the conductor patterns Pt81 and Pt91 through a via-conductor VH41 extending in the stacking direction of the dielectric layers. The via-conductor VH41 is also connected to a conductor pattern Pt121 provided on the dielectric layer LY12.

The other ends of the conductor patterns Pt101 and Pt111 are connected to the conductor pattern Pt21 of the dielectric layer LY2 through a via-conductor VH11 extending in the stacking direction of the dielectric layers.

One end of each of the conductor patterns Pt102 and Pt112 is connected to the other ends of the conductor patterns Pt82 and Pt92 through a via-conductor VH42 extending in the stacking direction of the dielectric layers. The via-conductor VH42 is also connected to a conductor pattern Pt122 provided on the dielectric layer LY12.

The other ends of the conductor patterns Pt102 and Pt112 are connected to the conductor pattern Pt22 of the dielectric layer LY2 through a via-conductor VH12 extending in the stacking direction of the dielectric layers.

With the above-described configuration, the inductor 211 is defined by the conductor patterns Pt101 and Pt111 and is configured as a spiral inductor having a central axis parallel or substantially parallel to the stacking direction of the dielectric layers. The conductor patterns Pt101 and Pt111 are connected to each other through the via-conductors VH11 and VH41. The inductor 221 is defined by the conductor patterns Pt41, Pt51, Pt61, Pt71, Pt81, and Pt91, and is configured as a spiral inductor having a central axis parallel or substantially parallel to the stacking direction of the dielectric layers. The conductor patterns Pt41, Pt51, Pt61, and Pt71 are connected to each other through the via-conductor VH21, and the conductor patterns Pt61, Pt71, Pt81, and Pt91 are connected to each other through the via-conductor VH31.

A via-conductor portion VH410 of the via-conductor VH41 that connects the conductor patterns Pt111 and Pt121 defines the linear inductor 231 extending in the stacking direction of the dielectric layers. With this structure, the inductance of the inductor 231 is smaller than that of the inductors 211 and 221.

The conductor patterns Pt41 through Pt111 are configured such that the openings at the central portions of the conductor patterns Pt41 through Pt91 are substantially superimposed on those of the conductor patterns Pt101 and Pt111. With this configuration, the inductors 211 and 221 are mutual-inductively coupled. Moreover, as shown in FIG. 6, in a conductor path starting from the conductor pattern Pt21 to the conductor patterns Pt41 and Pt51, the corresponding conductor patterns are connected to each other through the via-conductors VH11, VH21, VH31, and VH41 such that the winding direction of the conductor patterns Pt41 through Pt91 coincides with that of the conductor patterns Pt101 and Pt111. Thus, the inductors 211 and 221 are positively coupled with each other. That is, positive mutual-inductive coupling between the inductors 211 and 221 is easily and effectively achieved with a small structure.

The via-conductor portion VH410 of the via-conductor VH41 is preferably a linear conductor extending in the stacking direction of the dielectric layers. Accordingly, the inductor 231 defined by the via-conductor portion VH410 is only negligibly coupled with the inductors 211 and 221. In other words, it is possible to prevent or greatly reduce unwanted coupling between the inductors 211 and 221 and the inductor 231.

Similarly, the conductor patterns Pt102 and Pt112 and the via-conductors VH12 and VH42 define the spiral conductor 212 having a central axis parallel or substantially parallel to the stacking direction of the dielectric layers. The conductor patterns Pt42, Pt52, Pt62, Pt72, Pt82, and Pt92 and the via-conductors VH22 and VH32 define the spiral inductor 222 having a central axis parallel or substantially parallel to the stacking direction of the dielectric layers. A via-conductor portion VH420 of the via-conductor VH42 that connects the conductor patterns Pt112 and Pt122 defines the linear inductor 232 extending in the stacking direction of the dielectric layers. With this structure, the inductance of the inductor 232 is smaller than that of the inductors 212 and 222.

The conductor patterns Pt42 through pt112 are arranged such that the openings at the central portions of the conductor patterns Pt42 through Pt92 are substantially superimposed on those of the conductor patterns Pt102 and Pt112. With this configuration, the inductors 212 and 222 are mutual-inductively coupled. Moreover, as shown in FIG. 6, in a conductor path starting from the conductor pattern Pt22 to the conductor patterns Pt42 and Pt52, the corresponding conductor patterns are connected to each other through the via-conductors VH12, VH22, VH32, and VH42 such that the winding direction of the conductor patterns Pt42 through Pt92 coincides with that of the conductor patterns Pt102 and Pt112. Thus, the inductors 212 and 222 are positively coupled with each other. That is, positive mutual-inductive coupling between the inductors 212 and 222 is easily and effectively achieved with a small structure.

The via-conductor portion VH420 of the via-conductor VH42 is preferably a linear conductor extending in the stacking direction of the dielectric layers. Accordingly, the inductor 232 defined by the via-conductor portion VH420 is only negligibly coupled with the inductors 212 and 222. In other words, it is possible to prevent or greatly reduce unwanted coupling between the inductors 212 and 222 and the inductor 232.

The conductor patterns Pt121 and Pt122 are provided on the surface of the dielectric layer LY12. The conductor patterns Pt121 and Pt122 preferably have a rectangular or substantially rectangular shape. The conductor pattern Pt121 is disposed close to the first end surface of the dielectric layer LY12, while the conductor pattern Pt122 is disposed close to the second end surface of the dielectric layer LY12. The conductor patterns Pt121 and Pt122 are disposed close to the second side surface of the dielectric layer LY12 but are disposed close to the first side surface.

The conductor pattern Pt121 is connected to the conductor patterns Pt81, Pt91, Pt101, and Pt111 through the above-described via-conductor VH41 (VH410). The conductor pattern Pt122 is connected to the conductor patterns Pt82, Pt92, Pt102, and Pt112 through the above-described via-conductor VH42 (VH420).

A conductor pattern Pt130 is provided on the surface of the dielectric layer LY13. The conductor pattern Pt130 preferably has a rectangular or substantially rectangular shape and is provided on substantially the entire surface of the dielectric layer LY13. The conductor pattern Pt130 extends to the first and second side surfaces substantially at the center of the first and second side surfaces. The portion of the conductor pattern Pt130 that extends to the first side surface is connected to the external connecting terminal 914. The portion of the conductor pattern Pt130 that extends to the second side surface is connected to the external connecting terminal 917.

The conductor patterns Pt121 and Pt130 and the dielectric layer LY12 define the fixed capacitor 321. The conductor patterns Pt122 and Pt130 and the dielectric layer LY12 define the fixed capacitor 322.

With this structure, components of the variable-frequency filter 10A other than the variable capacitors 311 and 312 are provided in the multilayer body 91.

With the above-described configuration, the dielectric layers of the inductors 211, 221, 231, 212, 222, and 232 are disposed between the dielectric layers including the conductor patterns of the fixed capacitors 321 and 322 and the dielectric layers including the conductor patterns of the input/output coupling capacitors 401 and 402 and the inter-resonator coupling capacitor 410. With this arrangement, it is possible to prevent or greatly reduce unwanted coupling between the fixed capacitors 321 and 322 and the input/output coupling capacitors 401 and 402 and between the fixed capacitors 321 and 322 and the inter-resonator coupling capacitor 410.

The conductor pattern Pt30 provided on the dielectric layer LY3 and the conductor patterns Pt121 and Pt122 provided on the dielectric layer LY12 are not superimposed, as viewed from above, on the openings at the central portions of the conductor patterns Pt101 and Pt111 of the inductor 211, the conductor patterns Pt41 through Pt91 of the inductor 221, the conductor pattern Pt111 of the inductor 231, the conductor patterns Pt102 and Pt112 of the inductor 212, the conductor patterns Pt42 through Pt92 of the inductor 222, and the conductor pattern Pt112 of the inductor 232. Accordingly, it is possible to reduce the possibility that magnetic flux generated in the inductors 211, 221, 231, 212, 222, and 232 will be interrupted. Thus, inductors that exhibit excellent characteristics are obtained. Similarly, by making the dielectric layers on which the conductor patterns are provided relatively thick, the possibility that magnetic flux generated in each of the inductors 211, 221, 231, 212, 222, and 232 will be interrupted by the conductor patterns other than those of the corresponding inductor is reduced. Thus, inductors that exhibit excellent characteristics are obtained.

Additionally, the winding direction of the inductors 211 and 221 is preferably opposite to that of the inductors 212 and 222. Thus, even if the inductors 211 and 221 are disposed close to the inductors 212 and 222, it is possible to prevent or greatly reduce unwanted coupling therebetween.

Figure 7A:
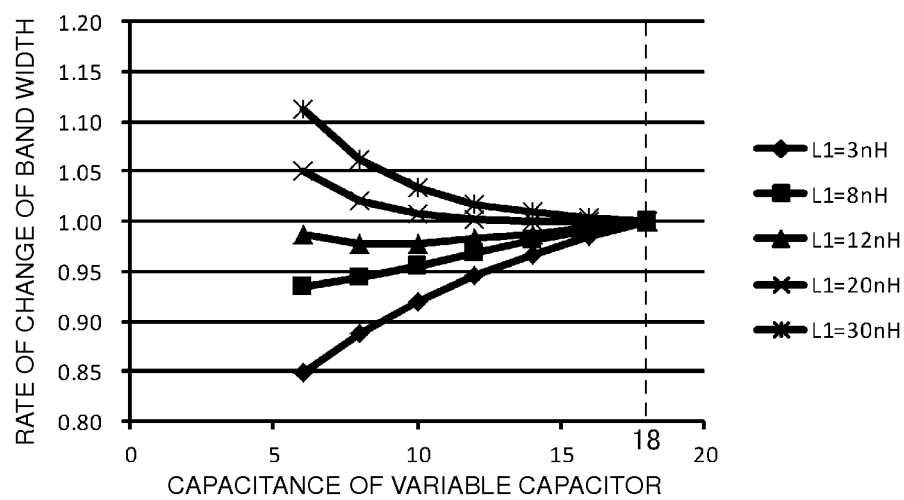
FIGS. 7A and 7B are diagrams illustrating an example of an approach to setting values of components forming the variable-frequency resonance circuit and the variable-frequency filter according to the first preferred embodiment of the present invention.
Figure 7B:
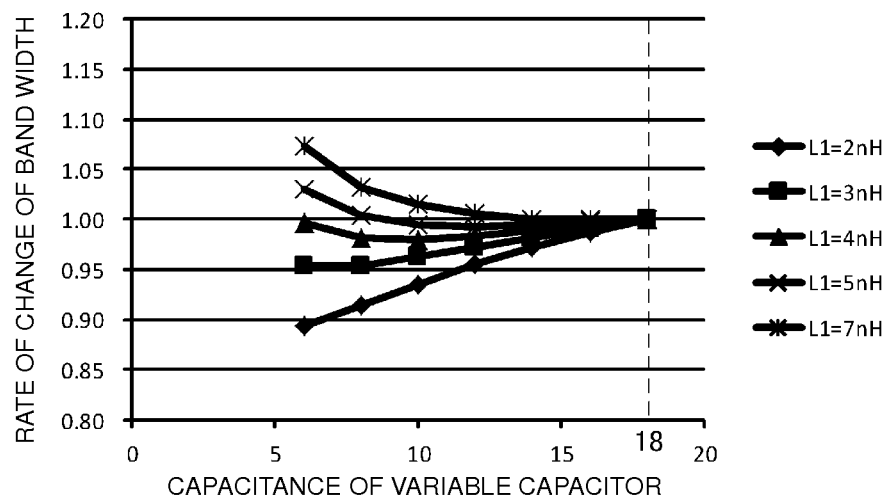

The inductance values of inductors and the capacitance of a capacitor of the variable-frequency resonance circuit 10 and the variable-frequency filter 10A of the first preferred embodiment may be determined as follows. FIGS. 7A and 7B are diagrams illustrating an example of a method of setting the inductance values of inductors and the capacitance of a capacitor forming the variable-frequency resonance circuit 10 and the variable-frequency filter 10A of the first preferred embodiment. Each of FIGS. 7A and 7B illustrates a variation in a rate of change of the band width in accordance with a change in the capacitance of a variable capacitor (with respect to 18 pF as a reference). FIG. 7A illustrates a variation in a rate of change of the band width when the resonant frequency is set to be around 500 MHz, and FIG. 7B illustrates a variation in a rate of change of the band width when the resonant frequency is set to be around 1000 MHz. In FIGS. 7A and 7B, in order to set a desired resonant frequency, appropriate inductance values of the inductors 22 and 23 (inductors 221 or 222 and 231 or 232 in the case of the variable-frequency filter 10A, which will also be designated by 22 and 23 below) and an appropriate capacitance of the fixed capacitor 32 (fixed capacitor 321 or 322 in the case of the variable-frequency filter 10A, which will also be designated by 32 below) are set. More specifically, in the case of FIG. 7A, the inductance values of the inductors 22 and 23 preferably are about 21 nH and about 0.5 nH, respectively, and the capacitance of the fixed capacitor 32 preferably is about 10 pF, for example. In the case of FIG. 7B, the inductance values of the inductors 22 and 23 preferably are about 4 nH and about 0.5 nH, respectively, and the capacitance of the fixed capacitor 32 preferably is about 8 pF, for example. The characteristic curves shown in FIGS. 7A and 7B are obtained by varying the inductance of the inductor 21.

As shown in FIG. 7A, when the resonant frequency is set to be around 500 MHz and when the inductance values of the inductors 22 and 23 and the capacitance of the fixed capacitor 32 are set as described above, if the inductance of the inductor 21 is about 8 nH to about 12 nH, the band width is unchanged or substantially unchanged even though the frequency band is shifted. That is, if the inductance ratio of the inductor 21 to the inductor 22 (using the inductance of the inductor 22 as a reference) preferably is about 0.5, for example, the band width is unchanged or substantially unchanged.

As shown in FIG. 7B, when the resonant frequency is set to be around 1000 MHz and when the inductance values of the inductors 22 and 23 and the capacitance of the fixed capacitor 32 are set as described above, if the inductance of the inductor 21 preferably is about 4 nH to about 5 nH, for example, the band width is unchanged or substantially unchanged even though the frequency band is shifted. That is, if the inductance ratio of the inductor 21 to the inductor 22 (using the inductance of the inductor 22 as a reference) preferably is about 1.0, for example, the band width is unchanged or substantially unchanged.

Although it is not shown, the inventors of the present invention have validated that, even if the resonant frequency is not around 500 MHz or around 1000 MHz, the band width is unchanged or substantially unchanged if the inductance ratio of the inductor 21 to the inductor 22 is about a specific value.

In this manner, in the variable-frequency resonance circuit 10 and the variable-frequency filter 10A of the first preferred embodiment, by setting the inductance ratio of the inductor 21 to the inductor 22 to be approximately a specific value in accordance with the resonant frequency, a variation in the band width is more reliably reduced or prevented.

The inductance values of the inductors 22 and 23 and the capacitance of the fixed capacitor 32 are not restricted to the above-described values, and may be changed according to desirable characteristics of the variable-frequency resonance circuit 10 and the variable-frequency filter 10A. In this case as well, by setting the inductance ratio of the inductor 21 to the inductor 22 to be approximately a specific value in accordance with the resonant frequency, a variation in the band width is more reliably reduced or prevented.

For example, the inductance of the inductor 22 and the capacitance of the fixed capacitor 32 are set in accordance with the attenuation characteristics of a low-frequency side of a pass band. Then, the inductance of the inductor 21 at which a variation in the band width will be reduced is set by using a certain inductance ratio determined in accordance with the resonant frequency.

Figure 8:
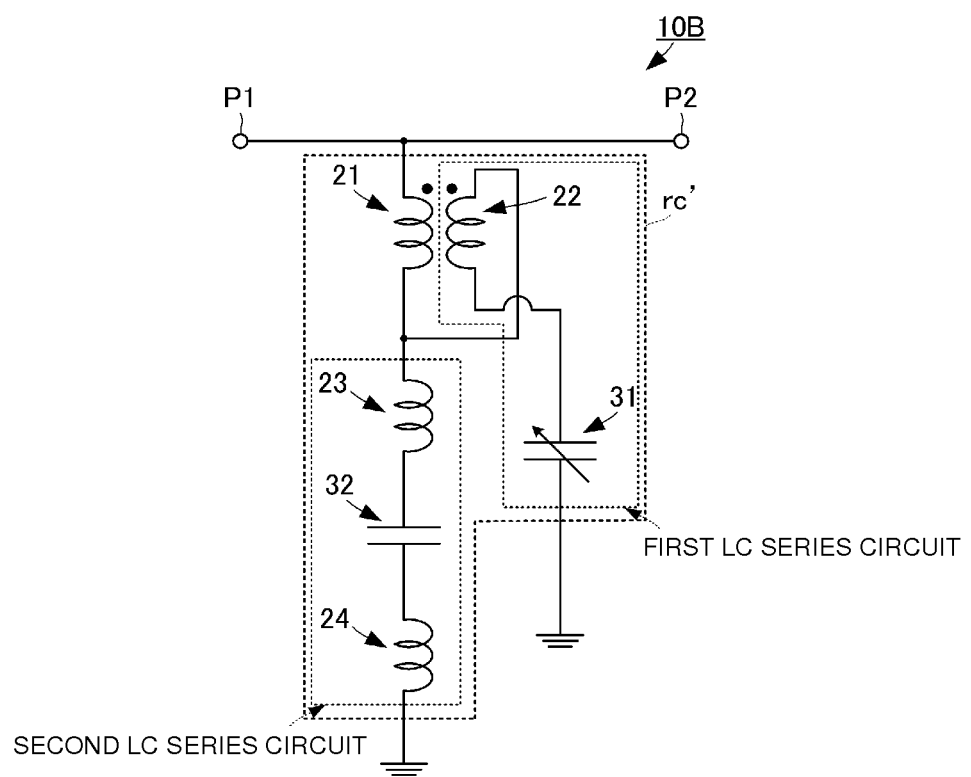
FIG. 8 is a circuit diagram illustrating a variable-frequency resonance circuit according to a second preferred embodiment of the present invention.

A variable-frequency resonance circuit and a variable-frequency filter according to a second preferred embodiment will now be described below with reference to the accompanying drawings. FIG. 8 is a circuit diagram illustrating a variable-frequency resonance circuit 10B of the second preferred embodiment. The variable-frequency resonance circuit 10B of the second preferred embodiment is different from the variable-frequency resonance circuit 10 of the first preferred embodiment in that an inductor 24 (corresponding to a fourth inductor) is also included in the variable-frequency resonance circuit 10. The configurations of the other components of the variable-frequency resonance circuit 10B preferably are the same or substantially the same as those of the variable-frequency resonance circuit 10. Thus, portions different from those of the first preferred embodiment will be described below.

In a resonance circuit portion rc' of the variable-frequency resonance circuit 10B, the inductor 24 is added to the resonance circuit portion rc of the variable-frequency resonance circuit 10. The inductor 24 is connected between the fixed capacitor 32 and a ground.

With this circuit configuration, a variable-frequency resonance circuit having an attenuation pole at a high frequency side of a pass band is provided. By changing the capacitance of the variable capacitor 31, the frequency of the pass band and the frequency of the attenuation pole in the variable-frequency resonance circuit 10B is shifted.

The specific circuit configuration will be discussed below. Two first and second LC series circuits are connected in parallel with the inductor 21, and the first and second LC series circuits and the inductor 21 are connected between the transmission line and a ground. The first LC series circuit includes the variable capacitor 31 and the inductor 22 connected in series with each other, and the inductor 22 is mutual-inductively and positively coupled with the inductor 21. With this circuit configuration, the band width is unchanged or substantially unchanged even when the frequency of the pass band is shifted.

In FIG. 8, the variable-frequency resonance circuit 10B using only one resonance circuit portion rc' is shown. However, a variable-frequency filter including two resonance circuit portions, such as that shown in FIG. 9, or a variable-frequency filter including three or more resonance circuit portions may be provided.

Figure 9:
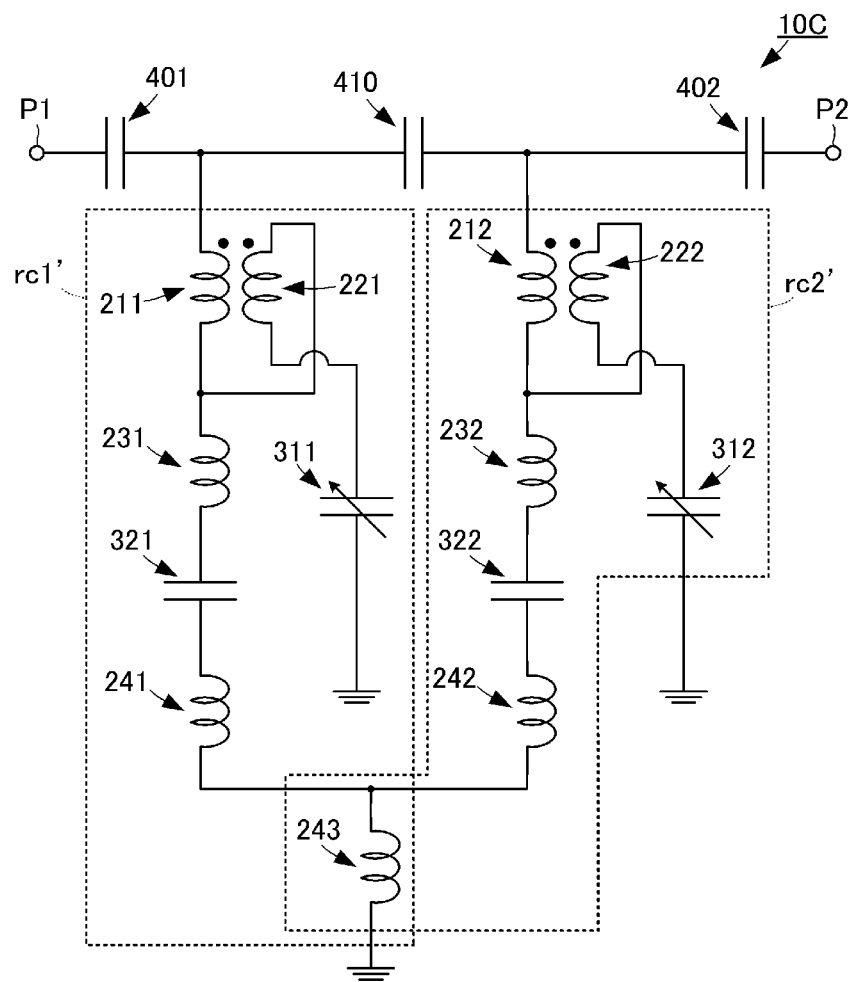
FIG. 9 is a circuit diagram illustrating a variable-frequency filter according to the second preferred embodiment of the present invention.

FIG. 9 is a circuit diagram illustrating a variable-frequency filter 10C according to the second preferred embodiment of the present invention. In a resonance circuit portion rc1' of the variable-frequency filter 10C, as shown in FIG. 9, inductors 241 and 243 are added to the resonance circuit portion rc1 of the variable-frequency filter 10A of the first preferred embodiment. The inductors 241 and 243 are connected between the fixed capacitor 321 and a ground. In a resonance circuit portion rc2' of the variable-frequency filter 10C, as shown in FIG. 9, inductors 242 and 243 are added to the resonance circuit portion rc2 of the variable-frequency filter 10A of the first preferred embodiment. The inductors 242 and 243 are connected between the fixed capacitor 322 and a ground. The inductor 243 is commonly used for the resonance circuit portions rc1' and rc2'.

In the variable-frequency filter 10C, as well as in the variable-frequency filter 10B, the band width is unchanged or substantially unchanged even when the frequency of the pass band is shifted.

Figure 10:
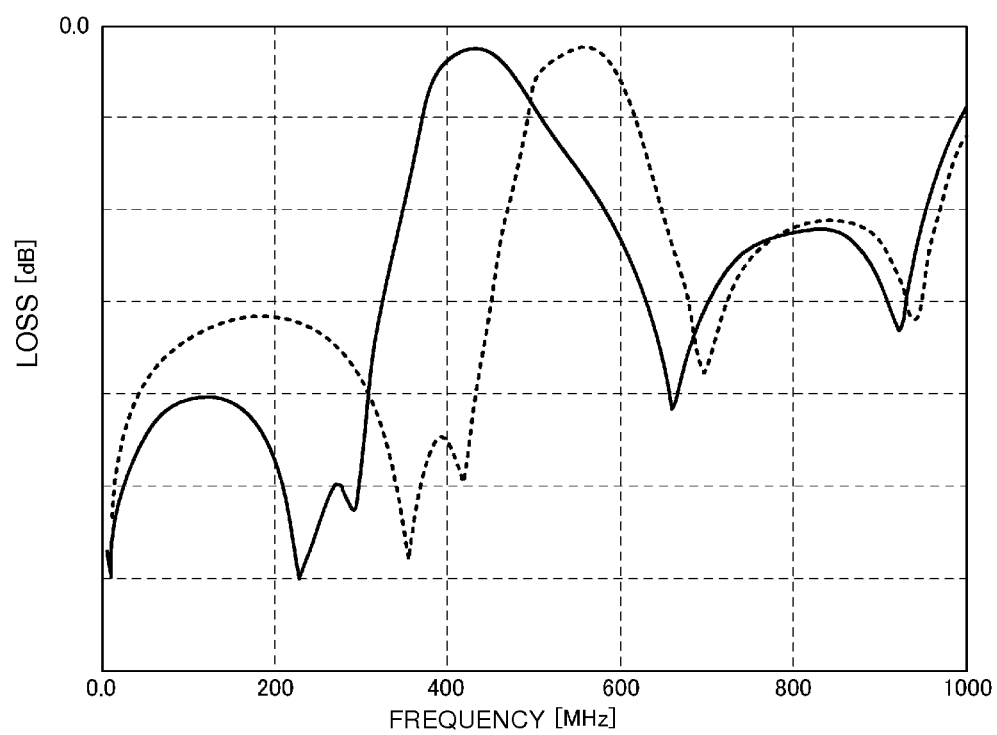
FIG. 10 is a diagram illustrating the transmission characteristics of the variable-frequency filter according to the second preferred embodiment of the present invention.

FIG. 10 is a diagram illustrating the transmission characteristics of the variable-frequency filter 10C of the second preferred embodiment.

In FIG. 10, the solid line indicates the transmission characteristics exhibited when a substantially 400-MHz band is set as the pass band, while the broken line indicates the transmission characteristics exhibited when a substantially 520-MHz band is set as the pass band.

As shown in FIG. 10, in a manner similar to the first preferred embodiment, the pass band width in a substantially 400-MHz band is substantially the same as the pass band width in a substantially 520-MHz band. In this manner, as well as in the variable-frequency filter 10B, in the variable-frequency filter 10C including a plurality of resonance circuit portions rc1' and rc2', the band width is unchanged or substantially unchanged even when the frequency of the pass band is shifted.

Since the variable-frequency filter 10C includes a plurality of variable-frequency resonance circuits, desired transmission characteristics and attenuation characteristics are achieved more precisely and more easily. Additionally, with the configuration of the second preferred embodiment, since an attenuation pole is provided at a high frequency side of the pass band, the attenuation characteristics at a high frequency side of the pass band can be made steep and can be selectively set.

Figure 11:
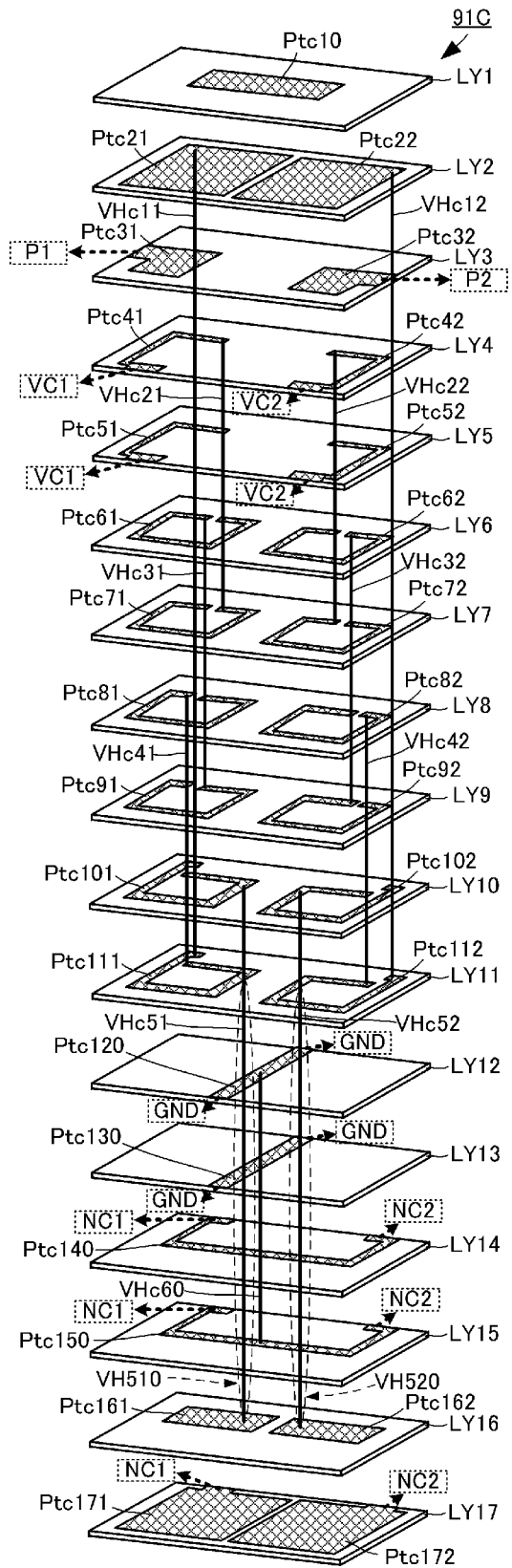
FIG. 11 is an exploded perspective view illustrating the structure of individual layers of a multilayer body for implementing the variable-frequency filter according to the second preferred embodiment of the present invention.
Figure 12:
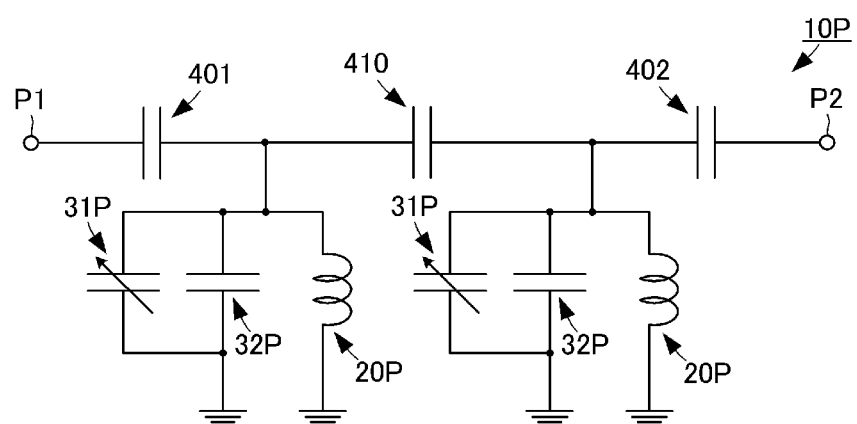
FIG. 12 is a circuit diagram illustrating an example of a variable-frequency filter of the related art.
Figure 13A:
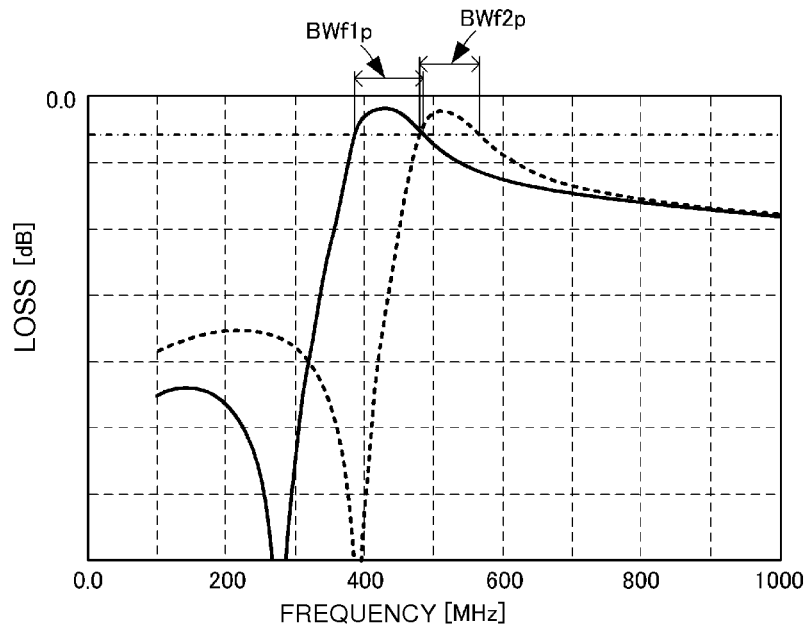
FIGS. 13A and 13B are diagrams illustrating the transmission characteristics of the variable-frequency filter shown in FIG. 12.
Figure 13B:
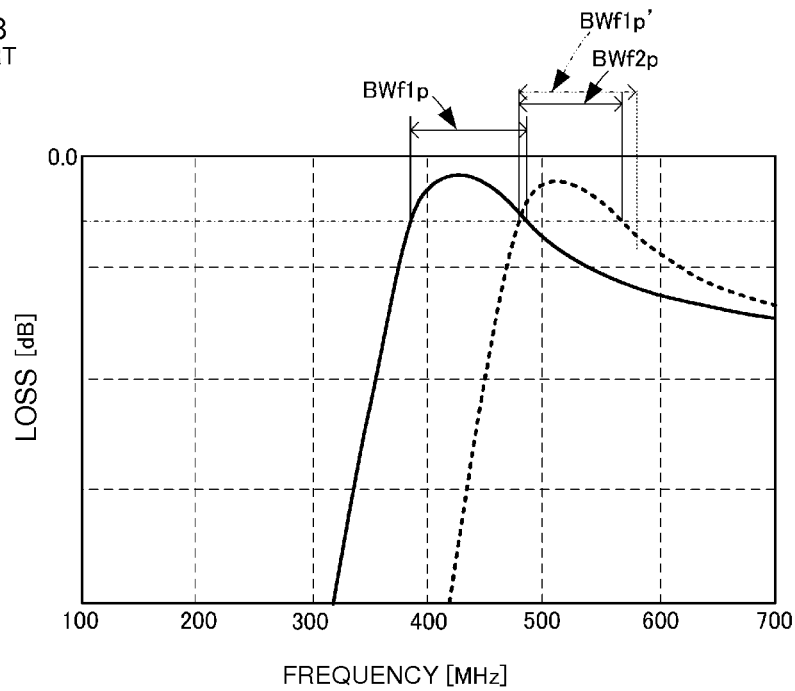

The variable-frequency filter 10C having the above-described circuit configuration preferably has the following structure. FIG. 11 is an exploded perspective view illustrating the structure of individual layers of a multilayer body 91C of the variable-frequency filter 10C according to the second preferred embodiment.

As shown in FIG. 11, the multilayer body 91C includes seventeen dielectric layers LY1 through LY17, for example. A dielectric layer on which no conductor pattern is provided may be disposed on top of the dielectric layer LY1.

A conductor pattern Ptc10 is provided substantially at the center of the surface of the dielectric layer LY1. The conductor pattern Ptc10 preferably has a rectangular or substantially rectangular shape.

Conductor patterns Ptc21 and Ptc22 are provided on the surface of the dielectric layer LY2. The conductor patterns Ptc21 and Ptc22 preferably have a rectangular or substantially rectangular shape. The conductor pattern Ptc21 is disposed close to the first end surface of the dielectric layer LY1. The conductor pattern Ptc22 is disposed close to the second end surface of the dielectric layer LY1. The conductor patterns Ptc21 and Ptc22 partially oppose the conductor pattern Ptc10.

The conductor patterns Ptc21, Ptc22, and Ptc10 and the dielectric layer LY1 define the inter-resonator coupling capacitor 410.

Conductor patterns Ptc31 and Ptc32 are provided on the surface of the dielectric layer LY3. The conductor patterns Ptc31 and Ptc32 preferably have a rectangular or substantially rectangular shape. The conductor pattern Ptc31 is disposed close to the first end surface of the dielectric layer LY3. A portion of the conductor pattern Ptc31 extends to the first end surface and is connected to the external connecting terminal 911. The conductor pattern Ptc32 is disposed close to the second end surface of the dielectric layer LY3. A portion of the conductor pattern Ptc32 extends to the second end surface and is connected to the external connecting terminal 912.

The conductor pattern Ptc31 opposes the conductor pattern Ptc21, while the conductor pattern Ptc32 opposes the conductor pattern Ptc22.

The conductor patterns Ptc31 and Ptc21 and the dielectric layer LY2 define the input/output coupling capacitor 401. The conductor patterns Ptc32 and Ptc22 and the dielectric layer LY2 define the input/output coupling capacitor 402.

Conductor patterns Ptc41 and Ptc42 are provided on the surface of the dielectric layer LY4. The conductor patterns Ptc41 and Ptc42 are linear conductors preferably having a substantially angular C shape, as viewed from above. The conductor pattern Ptc41 is disposed close to the first end surface of the dielectric layer LY4. One end of the conductor pattern Ptc41 is wider than other portions of the conductor pattern Ptc41 and extends to the first side surface. The portion extending to the first side surface is connected to the external connecting terminal 913. The conductor pattern Ptc42 is disposed close to the second end surface of the dielectric layer LY4. One end of the conductor pattern Ptc42 is wider than other portions of the conductor pattern Ptc42 and extends to the first side surface. The portion extending to the first side surface is connected to the external connecting terminal 915.

Conductor patterns Ptc51 and Ptc52 are provided on the surface of the dielectric layer LY5. The conductor patterns Ptc51 and Ptc52 preferably have the same or substantially the same shape as that of the conductor patterns Ptc41 and Ptc42 provided on the dielectric layer LY4. The conductor patterns Ptc51 and Ptc52 are respectively superimposed on the conductor patterns Ptc41 and Ptc42 provided on the dielectric layer LY4, as viewed from above.

Conductor patterns Ptc61 and Ptc62 are provided on the surface of the dielectric layer LY6. The conductor patterns Ptc61 and Ptc62 are linear conductors preferably having a substantially angular C shape, as viewed from above. The conductor pattern Ptc61 is disposed close to the first end surface of the dielectric layer LY6. The conductor pattern Ptc62 is disposed close to the second end surface of the dielectric layer LY6.

Conductor patterns Ptc71 and Ptc72 are provided on the surface of the dielectric layer LY7. The conductor patterns Ptc71 and Ptc72 preferably have the same or substantially the same shape as that of the conductor patterns Ptc61 and Ptc62 provided on the dielectric layer LY6. The conductor patterns Ptc71 and Ptc72 are respectively superimposed on the conductor patterns Ptc61 and Ptc62 provided on the dielectric layer LY6, as viewed from above.

One end of each of the conductor patterns Ptc61 and Ptc71 is connected to the other ends of the conductor patterns Ptc41 and Ptc51 (the ends opposite to the wider ends) through a via-conductor VHc21 extending in the stacking direction of the dielectric layers.

One end of each of the conductor patterns Ptc62 and Ptc72 is connected to the other ends of the conductor patterns Ptc42 and Ptc52 (the ends opposite to the wider ends) through a via-conductor VHc22 extending in the stacking direction of the dielectric layers.

Conductor patterns Ptc81 and Ptc82 are provided on the surface of the dielectric layer LY8. The conductor patterns Ptc81 and Ptc82 are linear conductors preferably having a substantially angular C shape, as viewed from above. The conductor pattern Ptc81 is disposed close to the first end surface of the dielectric layer LY8. The conductor pattern Ptc82 is disposed close to the second end surface of the dielectric layer LY8.

Conductor patterns Ptc91 and Ptc92 are provided on the surface of the dielectric layer LY9. The conductor patterns Ptc91 and Ptc92 preferably have substantially the same shape as that of the conductor patterns Ptc81 and Ptc82 provided on the dielectric layer LY8. The conductor patterns Ptc91 and Ptc92 are respectively superimposed on the conductor patterns Ptc81 and Ptc82 provided on the dielectric layer LY8, as viewed from above.

One end of each of the conductor patterns Ptc81 and Ptc91 is connected to the other ends of the conductor patterns Ptc61 and Ptc71 through a via-conductor VHc31 extending in the stacking direction of the dielectric layers.

One end of each of the conductor patterns Ptc82 and Ptc92 is connected to the other ends of the conductor patterns Ptc62 and Ptc72 through a via-conductor VHc32 extending in the stacking direction of the dielectric layers.

Conductor patterns Ptc101 and Ptc102 are provided on the surface of the dielectric layer LY10. The conductor patterns Ptc101 and Ptc102 are linear conductors preferably having a substantially angular C shape, as viewed from above. The conductor pattern Ptc101 is disposed close to the first end surface of the dielectric layer LY10. The conductor pattern Ptc102 is disposed close to the second end surface of the dielectric layer LY10.

Conductor patterns Ptc111 and Ptc112 are provided on the surface of the dielectric layer LY11. The conductor patterns Ptc111 and Ptc112 preferably have the same or substantially the same shape as that of the conductor patterns Ptc101 and Ptc102 provided on the dielectric layer LY10. The conductor patterns Ptc111 and Ptc112 are respectively superimposed on the conductor patterns Ptc101 and Ptc102 provided on the dielectric layer LY10, as viewed from above.

One end of each of the conductor patterns Ptc101 and Ptc111 is connected to the other ends of the conductor patterns Ptc81 and Ptc91 through a via-conductor VHc41 extending in the stacking direction of the dielectric layers.

The other ends of the conductor patterns Ptc101 and Ptc111 are connected to the conductor pattern Ptc21 of the dielectric layer LY2 through a via-conductor VHc11 extending in the stacking direction of the dielectric layers.

One end of a via-conductor VHc51 extending in the stacking direction of the dielectric layers is connected to a portion approximately half way through one widthwise side of each of the conductor patterns Ptc101 and Ptc111. The other end of the via-conductor VHc51 is connected to a conductor pattern Ptc161 provided on the dielectric layer LY16, which will be discussed later.

One end of each of the conductor patterns Ptc102 and Ptc112 is connected to the other ends of the conductor patterns Ptc82 and Ptc92 through a via-conductor VHc42 extending in the stacking direction of the dielectric layers.

The other ends of the conductor patterns Ptc102 and Ptc112 are connected to the conductor pattern Ptc22 of the dielectric layer LY2 through a via-conductor VHc12 extending in the stacking direction of the dielectric layers.

One end of a via-conductor VHc52 extending in the stacking direction of the dielectric layers is connected to a portion approximately half way through one widthwise side of each of the conductor patterns Ptc102 and Ptc112. The other end of the via-conductor VHc52 is connected to a conductor pattern Ptc162 provided on the dielectric layer LY16, which will be discussed later.

With the above-described configuration, the via-conductor VHc11 and a portion of the conductor patterns Ptc101 and Ptc111 positioned between the via-conductors VHc11 and VHc51 define the spiral inductor 211 having a central axis parallel or substantially parallel to the stacking direction of the dielectric layers. The conductor patterns Ptc41, Ptc51, Ptc61, Ptc71, Ptc81, and Ptc91, a portion of the conductor patterns Ptc101 and Ptc111 positioned between the via-conductors VHc41 and VHc51, and the via-conductors VHc21 and VHc31 define the spiral inductor 221 having a central axis parallel or substantially parallel to the stacking direction of the dielectric layers. The via-conductor VHc51 form the linear inductor 231 extending in the stacking direction of the dielectric layers.

The conductor patterns Ptc41 through Ptc111 are arranged such that the openings at the central portions of the conductor patterns Ptc41 through Ptc111 are substantially superimposed on each other. With this configuration, the inductors 211 and 221 are mutual-inductively coupled. Moreover, as shown in FIG. 11, in a conductor path starting from the conductor pattern Ptc21 to the conductor patterns Ptc41 and Ptc51, the conductor patterns Ptc41 through Ptc111 are connected to each other through the via-conductors VHc11, VHc21, VHc31, and VHc41 such that the winding directions of the conductor patterns Ptc41 through Ptc111 coincide with each other. Thus, the inductors 211 and 221 are positively coupled with each other. That is, positive mutual-inductive coupling between the inductors 211 and 221 is easily and effectively achieved with a small structure.

The via-conductor VHc51 is a linear conductor extending in the stacking direction of the dielectric layers. Accordingly, the inductor 231 defined by the via-conductor VHc51 is only negligibly coupled with the inductors 211 and 221. In other words, it is possible to prevent or greatly reduce unwanted coupling between the inductors 211 and 221 and the inductor 231.

Similarly, the via-conductor VHc12 and a portion of the conductor patterns Ptc102 and Ptc112 positioned between the via-conductors VHc12 and VHc52 define the spiral inductor 212 having a central axis parallel or substantially parallel to the stacking direction of the dielectric layers. The conductor patterns Ptc42, Ptc52, Ptc62, Ptc72, Ptc82, and Ptc92, a portion of the conductor patterns Ptc102 and Ptc112 positioned between the via-conductors VHc42 and VHc52, and the via-conductors VHc22 and VHc32 define the spiral inductor 222 having a central axis parallel or substantially parallel to the stacking direction of the dielectric layers. The via-conductor VHc52 defines the linear inductor 232 extending in the stacking direction of the dielectric layers.

The conductor patterns Ptc42 through Ptc112 are disposed such that the openings at the central portions of the conductor patterns Ptc42 through Ptc112 are substantially superimposed on each other. With this configuration, the inductors 212 and 222 are mutual-inductively coupled. Moreover, as shown in FIG. 11, in a conductor path starting from the conductor pattern Ptc22 to the conductor patterns Ptc42 and Ptc52, the conductor patterns Ptc42 through Ptc112 are connected to each other through the via-conductors VHc12, VHc22, VHc32, and VHc42 such that the winding directions of the conductor patterns Ptc42 through Ptc112 coincide with each other. Thus, the inductors 212 and 222 are positively coupled with each other. That is, positive mutual-inductive coupling between the inductors 212 and 222 is easily and effectively achieved with a small structure.

The via-conductor VHc52 is a linear conductor extending in the stacking direction of the dielectric layers. Accordingly, the inductor 232 defined by the via-conductor VHc52 is only negligibly coupled with the inductors 212 and 222. In other words, it is possible to prevent or greatly reduce unwanted coupling between the inductors 212 and 222 and the inductor 232.

The conductor pattern Ptc120 is provided on the surface of the dielectric layer LY12. The conductor pattern Ptc120 is preferably configured as a substantially wide, linear conductor pattern. In other words, the conductor pattern Ptc120 is wider than the linear conductor patterns of the inductors. The conductor pattern Ptc120 extends in the widthwise direction substantially at the central portion of the dielectric layer LY12 in the longitudinal direction. One end of the conductor pattern Ptc120 extends to the first side surface and is connected to the external connecting terminal 914. The other end of the conductor pattern Ptc120 extends to the second side surface and is connected to the external connecting terminal 917.

A conductor pattern Ptc130 is provided on the surface of the dielectric layer LY13. The conductor pattern Ptc130 preferably has substantially the same shape as that of the conductor pattern Ptc120 provided on the dielectric layer LY12. The conductor pattern Ptc130 is superimposed on the conductor pattern Ptc120 provided on the dielectric layer LY12, as viewed from above. By providing a plurality of conductor patterns on the surfaces of the dielectric layers LY12 and LY13, a plurality of inductors are provided. This makes it possible to adjust the number of attenuation poles and the frequency of an attenuation pole.

A conductor pattern Ptc140 is provided on the surface of the dielectric layer LY14. The conductor pattern Ptc140 is a linear conductor preferably having a substantially angular C shape, as viewed from above. The conductor pattern Ptc140 is disposed close to the second side surface of the dielectric layer LY14. Both ends of the conductor pattern Ptc140 are wider and extend to the second side surface. One end of the conductor pattern Ptc140 is connected to the external connecting terminal 916, and the other end thereof is connected to the external connecting terminal 918.

A conductor pattern Ptc150 is provided on the surface of the dielectric layer LY15. The conductor pattern Ptc150 preferably has the same or substantially the same shape as that of the conductor pattern Ptc140 provided on the dielectric layer LY14. The conductor pattern Ptc150 is superimposed on the conductor pattern Ptc140 provided on the dielectric layer LY14, as viewed from above.

The substantially central portions of the conductor patterns Ptc140 and Ptc150 in its extending direction are connected to the substantially central portions of the conductor patterns Ptc120 and Ptc130 in its extending direction through a via-conductor VHc60 extending in the stacking direction.

The conductor patterns Ptc120 and Ptc130 and the via-conductor VHc60 define the inductor 243. The inductor 241 defined by a portion between one end of the conductor pattern Ptc140 and a position of the conductor pattern Ptc140 connected to the via-conductor VHc60 and a portion between one end of the conductor pattern Ptc150 and a position of the conductor pattern Ptc150 connected to the via-conductor VHc60. The inductor 242 is defined by a portion between the other end of the conductor pattern Ptc140 and the position of the conductor pattern Ptc140 connected to the via-conductor VHc60 and a portion between the other end of the conductor pattern Ptc150 and the position of the conductor pattern Ptc150 connected to the via-conductor VHc60.

As shown in FIG. 11, the extending direction of the principal portions of the conductor patterns Ptc140 and Ptc150 is perpendicular or substantially perpendicular to that of the conductor patterns Ptc120 and Ptc130. This makes it possible to prevent or greatly reduce unwanted coupling between the inductor 243 and the inductors 241 and 242.

The conductor patterns Ptc161 and Ptc162 are provided on the surface of the dielectric layer LY16. The conductor patterns Ptc161 and Ptc162 preferably have a rectangular or substantially rectangular shape. The conductor pattern Ptc161 is disposed close to the first end surface of the dielectric layer LY16, while the conductor pattern Ptc162 is disposed close to the second end surface of the dielectric layer LY16. The conductor patterns Ptc161 and Ptc162 are disposed close to the second side surface of the dielectric layer LY16 but are not disposed close to the first side surface.

The conductor pattern Ptc161 is connected to the conductor patterns Ptc101 and Ptc111 through the via-conductor VHc51. A via-conductor portion VHc510 of the via-conductor VHc51 between the conductor patterns Ptc161 and Ptc111 defines the inductor 231.

The conductor pattern Ptc162 is connected to the conductor patterns Ptc102 and Ptc112 through the via-conductor VHc52. A via-conductor portion VHc520 of the via-conductor VHc52 between the conductor patterns Ptc162 and Ptc112 defines the inductor 232.

In this manner, the extending direction of the via-conductors VHc51 and VHc52 defining the inductors 231 and 232, respectively, is perpendicular or substantially perpendicular to that of the principal portions of the conductor patterns Ptc140 and Ptc150 defining the inductors 241 and 242, respectively, and that of the conductor patterns Ptc120 and Ptc130 defining the inductor 243. This makes it possible to prevent or greatly reduce unwanted coupling between the inductors 231 and 232 and the inductors 241, 242, and 243.

Conductor patterns Ptc171 and Ptc172 are provided on the surface of the dielectric layer LY17. The conductor patterns Ptc171 and Ptc172 preferably have a rectangular or substantially rectangular shape. The conductor pattern Ptc171 is disposed close to the first end surface of the dielectric layer LY17. A portion of the conductor pattern Ptc171 extends to the second side surface and is connected to the external connecting terminal 916. The conductor pattern Ptc172 is disposed close to the second end surface of the dielectric layer LY17. A portion of the conductor pattern Ptc172 extends to the second side surface and is connected to the external connecting terminal 918.

The conductor pattern Ptc171 opposes the conductor pattern Ptc161 provided on the dielectric layer LY16. The conductor patterns Ptc171 and Ptc161 and the dielectric layer LY16 define the fixed capacitor 321. The conductor pattern Ptc172 opposes the conductor pattern Ptc162 provided on the dielectric layer LY16. The conductor patterns Ptc172 and Ptc162 and the dielectric layer LY16 define the fixed capacitor 322.

With the above-described structure, the variable-frequency filter 10C other than the variable capacitors 311 and 312 is provided in the multilayer body 91C.

With the above-described configuration, the dielectric layers defining the inductors 211, 221, 231, 212, 222, 232, 241, 242, and 243 are preferably disposed between the dielectric layers including the conductor patterns defining the fixed capacitors 321 and 322 and the dielectric layers including the conductor patterns defining the input/output coupling capacitors 401 and 402 and the inter-resonator coupling capacitor 410. With this arrangement, it is possible to prevent or greatly reduce unwanted coupling between the fixed capacitors 321 and 322 and the input/output coupling capacitors 401 and 402 and between the fixed capacitors 321 and 322 and the inter-resonator coupling capacitor 410.

The conductor patterns Ptc31 and Ptc32 provided on the dielectric layer LY3 and the conductor patterns Ptc161 and Ptc162 provided on the dielectric layer LY16 are not superimposed, as viewed from above, on the openings at the central portions of the conductor patterns Ptc101 and Ptc111 defining the inductor 211, the conductor patterns Ptc41 through Ptc91 defining the inductor 221, the conductor patterns Ptc101 and Ptc111 defining the inductor 231, the conductor patterns Ptc102 and Ptc112 defining the inductor 212, the conductor patterns Ptc42 through Ptc92 defining the inductor 222, and the conductor patterns Ptc102 and Ptc112 defining the inductor 232. Accordingly, it is possible to reduce the possibility that magnetic flux generated in the inductors 211, 221, 231, 212, 222, and 232 will be interrupted. Thus, inductors that exhibit excellent characteristics are obtained.

Additionally, the winding direction of the inductors 211 and 221 is opposite to that of the inductors 212 and 222. Thus, even if the inductors 211 and 221 are disposed close to the inductors 212 and 222, it is possible to prevent or greatly reduce unwanted coupling therebetween.

The openings at the central portions of the conductor patterns Ptc140 and Ptc150 defining the inductors 241 and 242 are not superimposed, as viewed from above, on the openings at the central portions of the conductor patterns Ptc101 and Ptc111 defining the inductor 211, the conductor patterns Ptc41 through Ptc91 defining the inductor 221, the conductor patterns Ptc101 and Ptc111 defining the inductor 231, the conductor patterns Ptc102 and Ptc112 defining the inductor 212, the conductor patterns Ptc42 through Ptc92 defining the inductor 222, and the conductor patterns Ptc102 and Ptc112 defining the inductor 232. With this arrangement, it is possible to prevent or greatly reduce unwanted coupling between the inductors 211, 221, 231, 212, 222, and 232 and the inductors 241 and 242.

In the above-described first and second preferred embodiments, linear conductor patterns defining an inductor are preferably provided on two adjacent layers. Alternatively, linear conductor patterns may be provided on one layer. However, by providing linear conductor patterns on two layers, the resistance of an inductor is reduced and the Q factor of an inductor is improved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A variable-frequency resonance circuit comprising:
   a transmission line;
   a first inductor connected at one end to the transmission line;
   a first LC series circuit connected to another end of the first inductor and including a second inductor and a variable capacitor; and
   a second LC series circuit connected to the another end of the first inductor and including a third inductor and a fixed capacitor; wherein
   the first and second LC series circuits are connected in parallel between the another end of the first inductor and a ground;
   the first and second inductors are mutual-inductively and positively coupled with each other; and
   the third inductor of the second LC series circuit is directly connected to the another end of the first inductor.

2. A variable-frequency filter comprising:
   a plurality of variable-frequency resonance circuits according to claim 1; wherein
   the transmission line connects the plurality of variable-frequency resonance circuits to one another; and
   an inter-resonator coupling element is connected to the transmission line.

3. The variable-frequency filter according to claim 2, wherein:
the plurality of variable-frequency resonance circuits are defined by a multilayer body including a plurality of dielectric layers stacked on each other;
components of each of the plurality of variable-frequency resonance circuits other than the variable capacitor of the first LC series circuit are provided in the multilayer body;
each of the first and second inductors are defined by a spiral conductor pattern having a central axis parallel or substantially parallel with a stacking direction of the plurality of dielectric layers of the multilayer body, and an opening at a central portion of the spiral conductor pattern defining the first inductor in each of the plurality of variable-frequency resonance circuits is at least partially superimposed on an opening at a central portion of the spiral conductor pattern defining the corresponding second inductor in each of the plurality of variable-frequency resonance circuits; and
a conductor pattern defining the fixed capacitor in each of the plurality of variable-frequency resonance circuits and a conductor pattern defining the inter-resonator coupling element are disposed such that dielectric layers included in between the first and second inductors of each of the plurality of variable-frequency resonance circuits are sandwiched between the conductor pattern defining the fixed capacitor in each of the plurality of variable-frequency resonance circuits and the conductor pattern defining the inter-resonator coupling element.

4. The variable-frequency filter according to claim 3, wherein the conductor patterns defining the fixed capacitor in each of the plurality of variable-frequency resonance circuits and the conductor pattern defining the inter-resonator coupling element provided on dielectric layers positioned closest to a dielectric layer of the first inductors and a dielectric layer of the second inductor are disposed such that the conductor patterns defining the fixed capacitor in each of the plurality of variable-frequency resonance circuits and the conductor pattern defining the inter-resonator coupling element are neither superimposed on the opening at the central portion of the spiral conductor pattern defining the first inductor in each of the plurality of variable-frequency resonance circuits nor the opening at the central portion of the spiral conductor pattern defining the second inductor in each of the plurality of variable-frequency resonance circuits.

5. The variable-frequency filter according to claim 4, wherein the conductor patterns defining the fixed capacitor in each of the plurality of variable-frequency resonance circuits and the conductor pattern defining the inter-resonator coupling element are disposed such that dielectric layers of the first, second, and fourth inductors are sandwiched between the conductor patterns defining the fixed capacitor in each of the plurality of variable-frequency resonance circuits and the conductor pattern defining the inter-resonator coupling element.

6. The variable-frequency filter according to claim 2, wherein the inter-resonator coupling element is a capacitor.

7. The variable-frequency resonance circuit according to claim 1, wherein:
the variable-frequency resonance circuit is defined by a multilayer body including a plurality of dielectric layers stacked on each other;
components of the variable-frequency resonance circuit other than the variable capacitor of the first LC series circuit are included in the multilayer body; and
each of the first and second inductors are defined by a spiral conductor pattern having a central axis parallel or substantially parallel to a stacking direction of the plurality of dielectric layers of the multilayer body; and
an opening at a central portion of the spiral conductor pattern defining the first inductor is at least partially superimposed on an opening at a central portion of the spiral conductor pattern defining the second inductor.

8. The variable-frequency resonance circuit according to claim 7, wherein the third inductor is defined by a via-conductor extending in parallel or substantially parallel to the stacking direction.

9. The variable-frequency resonance circuit according to claim 1, wherein a winding direction of the first inductor and a winding direction of the second inductor are identical or substantially identical to each other.

10. The variable-frequency resonance circuit according to claim 1, wherein the second LC series circuit includes a fourth inductor connected in series with the third inductor and the fixed capacitor.

11. A variable-frequency filter comprising:
a plurality of variable-frequency resonance circuits according to claim 10; wherein
the transmission line connects the plurality of variable-frequency resonance circuits to one another;
an inter-resonator coupling element is connected to the transmission line; and
at least one of the fourth inductors disposed in the plurality of variable-frequency resonance circuits is commonly shared between the plurality of variable-frequency resonance circuits.

12. The variable-frequency filter according to claim 11, wherein:
the plurality of variable-frequency resonance circuits are defined by a multilayer body including a plurality of dielectric layers stacked on each other;
components of each of the plurality of variable-frequency resonance circuits other than the variable capacitor of the first LC series circuit are provided in the multilayer body;
each of the first and second inductors are defined by a spiral conductor pattern having a central axis parallel or substantially parallel to a stacking direction of the plurality of dielectric layers of the multilayer body, and an opening at a central portion of the spiral conductor pattern defining the first inductor in each of the plurality of variable-frequency resonance circuits is at least partially superimposed on an opening at a central portion of the spiral conductor pattern defining the corresponding second inductor in each of the plurality of variable-frequency resonance circuits; and
an extending direction of conductor patterns defining the respective fourth inductors separately used for the corresponding plurality of variable-frequency resonance circuits is perpendicular or substantially perpendicular to an extending direction of a conductor pattern defining the at least one of the fourth inductors commonly used for the plurality of variable-frequency resonance circuits.

13. The variable-frequency filter according to claim 12, wherein an extending direction of a conductor pattern defining the third inductor in each of the plurality of variable-frequency resonance circuits is perpendicular or substantially perpendicular to the extending direction of the conductor patterns defining the corresponding fourth inductors.

14. The variable-frequency filter according to claim 11, wherein the inter-resonator coupling element is a capacitor.

15. The variable-frequency filter according to claim 11, wherein a winding direction of the first inductor in each of the plurality of variable-frequency resonance circuits and a winding direction of the second inductor are identical or substantially identical to each other.

16. The variable-frequency filter according to claim 11, wherein:
the plurality of variable-frequency resonance circuits are defined by a multilayer body including a plurality of dielectric layers stacked on each other;
components of each of the plurality of variable-frequency resonance circuits other than the variable capacitor of the first LC series circuit are provided in the multilayer body;
each of the first and second inductors are defined by a spiral conductor pattern having a central axis parallel or substantially parallel with a stacking direction of the plurality of dielectric layers of the multilayer body, and an opening at a central portion of the spiral conductor pattern defining the first inductor in each of the plurality of variable-frequency resonance circuits is at least partially superimposed on an opening at a central portion of the spiral conductor pattern defining the corresponding second inductor in each of the plurality of variable-frequency resonance circuits; and
a conductor pattern defining the fixed capacitor in each of the plurality of variable-frequency resonance circuits and a conductor pattern defining the inter-resonator coupling element are disposed such that dielectric layers included in between the first and second inductors of each of the plurality of variable-frequency resonance circuits are sandwiched between the conductor pattern defining the fixed capacitor in each of the plurality of variable-frequency resonance circuits and the conductor pattern defining the inter-resonator coupling element.

17. The variable-frequency filter according to claim 16, wherein the conductor patterns defining the fixed capacitor and the conductor pattern defining the inter-resonator coupling element provided on dielectric layers positioned closest to a dielectric layer of the first inductors and a dielectric layer of the second inductor are disposed such that the conductor patterns defining the fixed capacitor and the conductor pattern defining the inter-resonator coupling element are neither superimposed on the opening at the central portion of the spiral conductor pattern defining the first inductor in each of the plurality of variable-frequency resonance circuits nor the opening at the central portion of the spiral conductor pattern defining the second inductor in each of the plurality of variable-frequency resonance circuits.

18. The variable-frequency filter according to claim 17, wherein the conductor patterns defining the fixed capacitor in each of the plurality of variable-frequency resonance circuits and the conductor pattern defining the inter-resonator coupling element are disposed such that dielectric layers of the first, second, and fourth inductors are sandwiched between the conductor patterns defining the fixed capacitor in each of the plurality of variable-frequency resonance circuits and the conductor pattern defining the inter-resonator coupling element.

19. The variable-frequency resonance circuit according to claim 18, wherein a winding direction of the first inductor in each of the plurality of variable-frequency resonance circuits and a winding direction of the second inductor are identical or substantially identical to each other.

* * * * *